(12) United States Patent
Strong et al.

(10) Patent No.: US 12,444,619 B2
(45) Date of Patent: Oct. 14, 2025

(54) PHYSICAL VAPOR DEPOSITION SEEDING FOR HIGH ASPECT RATIO VIAS IN GLASS CORE TECHNOLOGY

(71) Applicant: Intel Corporation, Santa Clara, CA (US)

(72) Inventors: Veronica Strong, Hillsboro, OR (US); Aleksandar Aleksov, Chandler, AZ (US); Georgios C. Dogiamis, Chandler, AZ (US); Telesphor Kamgaing, Chandler, AZ (US); Neelam Prabhu Gaunkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 974 days.

(21) Appl. No.: 17/349,667

(22) Filed: Jun. 16, 2021

(65) Prior Publication Data
US 2022/0406616 A1    Dec. 22, 2022

(51) Int. Cl.
*H01L 21/48*    (2006.01)
*H01L 23/498*    (2006.01)

(52) U.S. Cl.
CPC ...... *H01L 21/486* (2013.01); *H01L 23/49827* (2013.01)

(58) Field of Classification Search
None
See application file for complete search history.

(56) References Cited

U.S. PATENT DOCUMENTS

| | | | | |
|---|---|---|---|---|
| 2001/0045658 A1* | 11/2001 | Deboer | .............. | H10B 12/0335 257/E21.59 |
| 2012/0058605 A1* | 3/2012 | Fujii | .................... | H01L 23/481 438/118 |
| 2015/0021784 A1* | 1/2015 | Lin | ..................... | H01L 25/0657 438/459 |
| 2015/0319842 A1* | 11/2015 | Asano | .................... | H05K 1/115 205/125 |
| 2016/0143149 A1* | 5/2016 | Su | ........................ | H01L 21/486 29/841 |
| 2019/0206786 A1* | 7/2019 | Aleksov | .............. | H01L 21/4857 |
| 2021/0288027 A1* | 9/2021 | Leschkies | .............. | H05K 1/144 |

* cited by examiner

*Primary Examiner* — Ajay Ojha
*Assistant Examiner* — Pinaki Das
(74) *Attorney, Agent, or Firm* — Schwabe, Williamson & Wyatt P.C.

(57) ABSTRACT

Embodiments disclosed herein include package substrates and methods of fabricating such substrates. In an embodiment, a package substrate comprises a core with a first surface and a second surface opposite from the first surface. The package substrate further comprises a via hole through the core. In an embodiment the via hole comprises a first portion, a second portion, and a perforated ledge between the first portion and the second portion. In an embodiment, the package substrate further comprises a via filling the via hole.

11 Claims, 22 Drawing Sheets

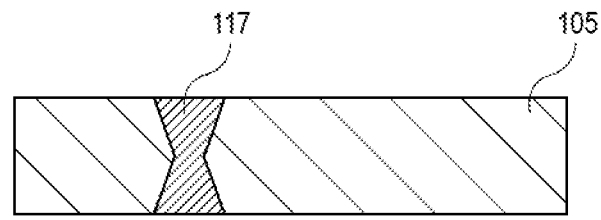
FIG. 1D
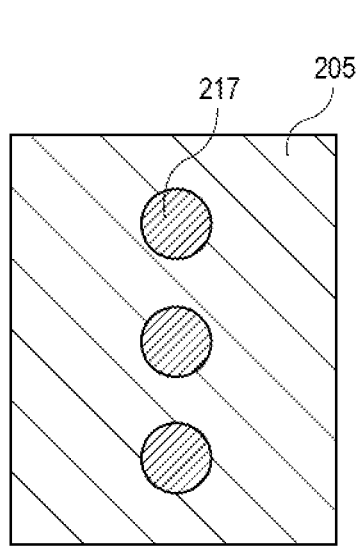 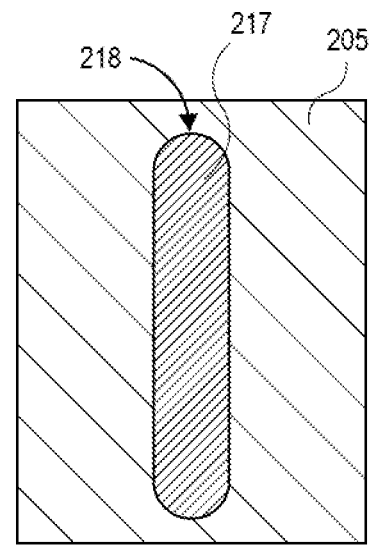
FIG. 2A        FIG. 2B

PHYSICAL VAPOR DEPOSITION SEEDING FOR HIGH ASPECT RATIO VIAS IN GLASS CORE TECHNOLOGY

TECHNICAL FIELD

Embodiments of the present disclosure relate to electronic packages, and more particularly to package substrates with a glass core with high aspect ratio vias formed physical vapor deposition process.

BACKGROUND

Highly integrated microelectronic systems are required to satisfy the continuous increase in data demand as well as the overall user experience. This has led to new integration strategies requiring die disaggregation and re-stitching of semiconductor dies from different nodes and processes. Additionally, an increased number of dies are needed to be co-integrated in close proximity to each other on the same package substrate. Integrating multiple dies using 3D-IC technologies leads to a small footprint, but comes with thermal management challenges that continue to grow exponentially as the number of the dies or active device layers in the 3D-IC stack-up increases.

As more dies are included in the platform, the thermal challenge can be alleviated by spreading out dies across a large package. In currently available high-speed systems, latency, bandwidth density, and power efficiency determine the relative locations of the high-speed dies associated with computing and storage. For example, most high-speed dies must be on the same side of the package substrate since going through an organic package core is detrimental to either bandwidth density and/or power efficiency. The inherent drawback results in an increase in the package size and low yield from substrate manufacturing and potential assembly.

BRIEF DESCRIPTION OF THE DRAWINGS

FIG. 1D is a cross-sectional illustration of the glass core with a via through the thickness of the glass core, in accordance with an embodiment.

FIG. 2A is a plan view illustration of the glass core with a plurality of circular vias, in accordance with an embodiment.

FIG. 2B is a plan view illustration of the glass core with a via plane, in accordance with an embodiment.

EMBODIMENTS OF THE PRESENT DISCLOSURE

Figure 1A:
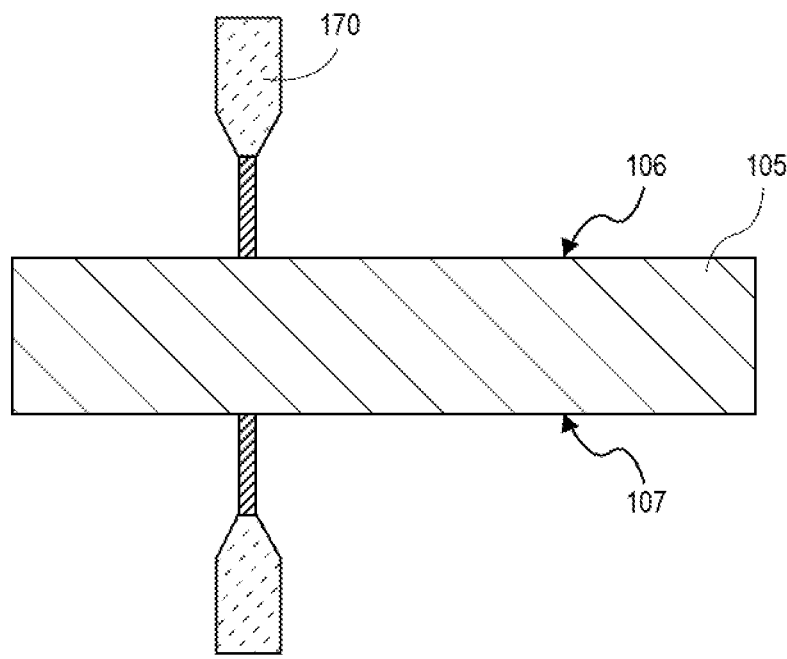
FIG. 1A is a cross-sectional illustration of a glass core with top and bottom surfaces that are being exposed with a laser, in accordance with an embodiment.

Described herein are package substrates with a glass core with high aspect ratio vias formed physical vapor deposition process, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the ever growing need to satisfy the continuous increase in data demand requires improvements in many areas of electronics packaging. One solution for improving electrical performance (e.g., bandwidth density, power efficiency, latency, etc.) is to utilize lower loss materials for the package core. For example, glass has been proposed as a suitable choice for high performance package substrates. However, patterning processes are not fully developed for such platforms.

Accordingly, embodiments disclosed herein include patterning processes that allow for high density vias through the thickness of the core. Additionally, the dual damascene processes described herein allow for self-aligned pads and traces that also provide flexibility in the dimensions of the pads. In an embodiment, the dual damascene process is integrated with a laser exposure process. For example, a hardmask over the core is patterned to form an opening. A laser exposure within the opening provides a morphological change in a portion of the core. A subsequent etching process rapidly removes the exposed portion of the core, and a slow etch defines a recess that substantially matches the size of the opening through the hardmask. As such, a through hole opening and a recess are provided by a single etching process. The through hole opening and the recess may then be plated to form a pad and a via.

In some embodiments, the resulting via structures have high aspect ratios. For example, aspect ratios of 6:1 or greater, or 10:1 or greater are made possible with advanced plating processes disclosed herein. Such high aspect ratio vias are not currently able to be deposited using traditional electroplating processes. This is because the physical vapor deposition (PVD) or sputtering processes used to form the seed layer results in gaps in the via hole even when a seed layer is applied to both surfaces of the core. Thus, electroplating metal into the via hole becomes difficult, because there is no continuous electrical connection from one side of the core to the other side of the core. This results in non-uniform plating and voids at the center of the vias.

Higher aspect ratio plating is possible with electroless plating processes, but electroless plating is not without issue. For example, the metal catalyst (e.g., Pd-based) used to initiate growth of copper results in adhesion issues between the copper and the core. Additionally, electroless plating is relatively slow compared to electrolytic plating, and is an expensive option.

Accordingly, embodiments disclosed herein use a perforated ledge within the via hole. The purpose of the perforated ledge within the via hole is to provide a platform for depositing a metal seed layer that allows for via plating, similar to how a blind via is plated. The perforated ledge provides a surface onto which deposition can occur, thus reducing the aspect ratio so the entire top portion of the via hole can be covered by the seed layer. The opposite side of the via hole, below the perforated ledge, may also be coated with a seed layer. However, due to the higher aspect ratio, the entire bottom portion of the via hole may not be covered by the seed layer. When plating the bottom side, the plating may initiate at the perforations and continue up until reaching the seed layer, at which point electrical contact between the front and backside is made and allows for metal to be plated on the substrate and in the via hole simultaneously. As such, a plating process for high aspect ratio vias using a PVD seed layer and electrolytic plating is enabled.

Referring now to FIGS. 1A-1D, a series of cross-sectional illustrations depicting a laser-assisted etching process to form features in a package core is shown, in accordance with an embodiment. The laser-assisted etching process may be used to form various features (e.g., the conductive vias and planes) described herein. As shown in FIG. 1A, the package core 105 is exposed by a laser 170. The laser 170 may be irradiated over both a first surface 106 and a second surface 107. However, the laser 170 may only irradiate a single surface of the package core 105 in other embodiments.

In an embodiment, the package core 105 may comprise a material that is capable of forming a morphological change as a result of the exposure by the laser 170. For example, in the case of a glass package core 105, the morphological change may result in the conversion of an amorphous crystal structure to a crystalline crystal structure. In an embodiment, the package core 105 may have a thickness between the first surface 106 and the second surface 107 that is between 100 µm and 1,000 µm. However, it is to be appreciated that larger or smaller thicknesses may also be used for the package core 105 in other embodiments.

Figure 1B:
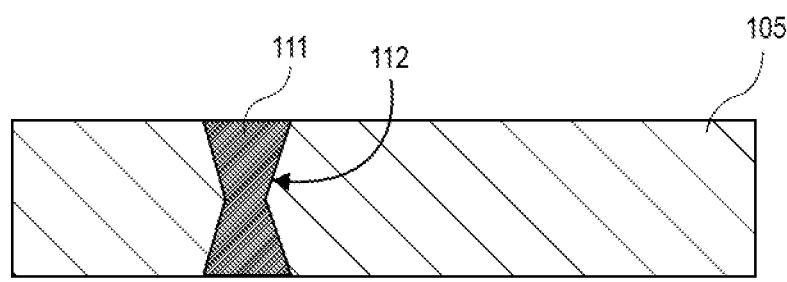
FIG. 1B is a cross-sectional illustration of the glass core with regions that have their morphology altered by the laser, in accordance with an embodiment.

Referring now to FIG. 1B, a cross-sectional illustration of the package core 105 after the morphological change has occurred is shown, in accordance with an embodiment. As shown, an exposed region 111 is provided through a thickness of the package core 105. In an embodiment, the exposed region 111 may have sidewalls 112 that are sloped. That is, the sidewalls 112 may not be substantially vertical (with respect to the first surface 106 and the second surface 107). In a particular embodiment, the exposed region 111 may have an hourglass shaped cross-section that results from exposure on both the first surface 106 and the second surface 107. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 112 may have a slope that is approximately 10° or less away from vertical. While shown with sloped sidewalls 112, it is also to be appreciated that embodiments may include substantially vertical sidewalls depending on the laser parameters and the material of the package core 105.

While shown as providing an exposed region 111 that passes through an entire thickness of the package core 105, it is to be appreciated that laser parameters may be modified in order to provide different structures. For example, a blind structure may be formed. A blind structure extends into, but not through, the package core 105. Furthermore, while shown as being substantially vertically oriented, the exposed region 111 may be at an angle with respect to a surface of the package core 105.

Figure 1C:
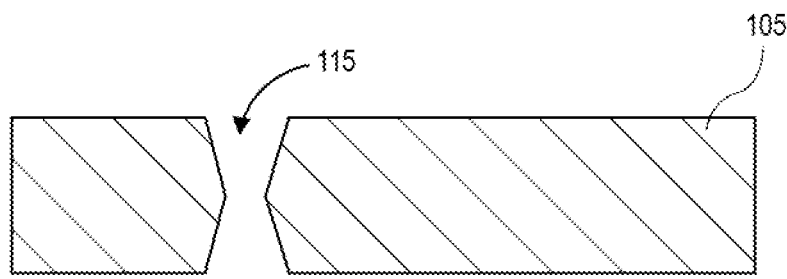
FIG. 1C is a cross-sectional illustration of the glass core with a via hole through a thickness of the glass core, in accordance with an embodiment.

Referring now to FIG. 1C, a cross-sectional illustration of the package core 105 after the exposed region 111 is removed to form a hole 115 through the package core 105 is shown, in accordance with an embodiment. In an embodiment, the hole 115 may be formed with an etching process that is selective to the exposed region 111 over the remainder of the package core 105. The etch selectivity of the exposed region 111 to the remainder of the package core 105 may be 10:1 or greater, or 50:1 or greater. That is, while selective to the exposed region 111, some portion of the package core 105 may also be etched, resulting in the thickness of the package core 105 being slightly reduced. In an embodiment, the etchant may be a wet etching chemistry.

Referring now to FIG. 1D, a cross-sectional illustration of the core substrate 105 after a via 117 is formed in the hole 115 is shown, in accordance with an embodiment. In an embodiment, the via 117 may be deposited with a plating process or any other suitable deposition process. In an embodiment, the hole 115 may have a maximum diameter that is approximately 100 µm or less, approximately 50 µm or less, or approximately 10 µm or less. The pitch between individual holes 115 in the package core 105 may be between approximately 10 µm and approximately 100 µm in some embodiments. The small diameters and pitch (compared to traditional plated through hole (PTH) vias that typically have diameters that are 100 µm or larger and pitches that are 100 µm or larger) allow for high density integration of vias.

In FIGS. 1A-1D only a single cross-section of the package core 105 is shown for simplicity. However, it is to be appreciated that the shape of the vias 117 may take substantially any form. This is because the laser providing the morphological change in the package core 105 may be moved in a controllable manner. Examples of various plan views of a via 217 in a package core 205 are shown in FIGS. 2A and 2B.

Referring now to FIG. 2A, a plan view illustration of a package core 205 with a plurality of circular vias 217 is shown, in accordance with an embodiment. While three vias 217 are shown, it is to be appreciated that any number of vias 217 may be provided in any configuration.

Referring now to FIG. 2B, a plan view illustration of a package core 205 with a via 217 that is extended along one direction is shown, in accordance with an embodiment. Such a via 217 may be referred to herein as a "via plane" or simply a "plane". The via plane 217 may have a thickness through the package core 205 that is substantially uniform, while also being extended in a direction, as opposed to having a width and length that are substantially uniform. As shown in FIG. 2B, the ends of the via structure 217 may be rounded surfaces 218. The rounded surfaces may be the result of the shape of the laser irradiation. That is, the focus of the laser may be substantially circular in some embodiments.

Figure 3A:
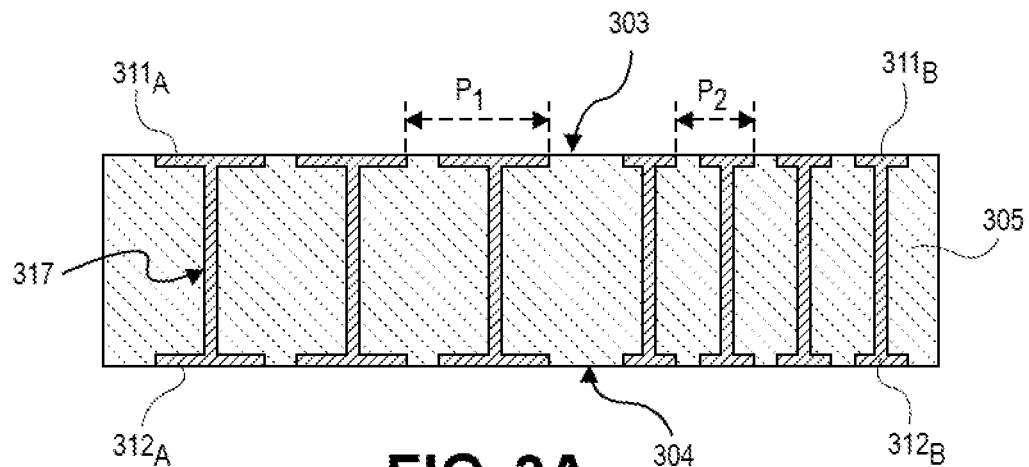
FIG. 3A is a cross-sectional illustration of a core with self-aligned vias with pads of different pitches, in accordance with an embodiment.

Referring now to FIG. 3A, a cross-sectional illustration of a package core 305 is shown, in accordance with an embodiment. The core 305 may be a material that can be altered by a laser to provide a morphological change that makes exposed regions more susceptible to an etching chemistry. For example, the core 305 may comprise glass, ceramic, silicon, or other non-conductive semiconductor materials. In an embodiment, a laser exposure process is used to form vias 317 and pads 311/312. The pads 311 and 312 may be embedded within the core 305. For example, a top surface of pads 311 may be substantially coplanar with a top surface 303 of the core 305, and a bottom surface of pads 312 may be substantially coplanar with a bottom surface 304 of the core 305. In the illustrated embodiment, the vias 317 are shown with substantially vertical sidewalls. However, it is to be appreciated that the vias 317 may have sloped sidewalls and/or an hourglass shaped cross-section. Additionally, vias 317 are shown to have the same via diameters, but vias 317 can have a combination of via diameters that are filled or unfilled or both filled/unfilled. In an embodiment, the pads 311/312 may be self-aligned with the vias 317. The self-aligned feature is a result of the processing used to form the vias 317 and the pads 311/312, and will be described in greater detail below.

In an embodiment, the laser patterning process (described in greater detail below) allows for significant flexibility in the size and pitch of the various features. For example, in FIG. 3A the first top pads $311_A$ may have a first pitch $P_1$, and the second top pads $311_B$ may have a second pitch $P_2$ that is smaller than the first pitch $P_1$. Similarly, first bottom pads $312_A$ may have the first pitch $P_1$ and second bottom pads $312_B$ may have the second pitch $P_2$. The first top pads $311_A$ and the first bottom pads $312_A$ may have a first width, and the second top pads $311_B$ and the second bottom pads $312_B$ may have a second width that is smaller than the first width.

Figure 3B:
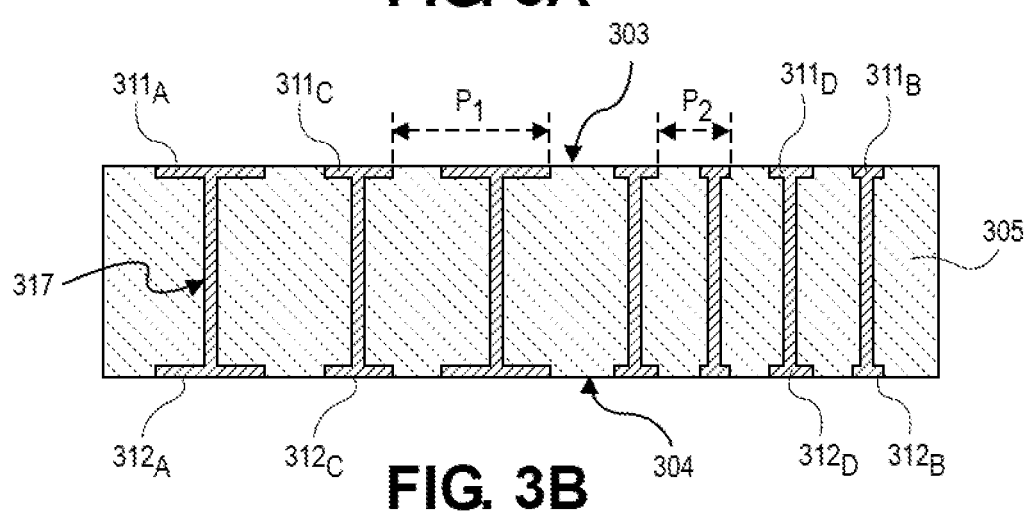
FIG. 3B is a cross-sectional illustration of a core with self-aligned vias with pads of different dimensions and with different pitches, in accordance with an embodiment.

Referring now to FIG. 3B, a cross-sectional illustration of a package core 305 is shown, in accordance with an additional embodiment. The core 305 in FIG. 3B is substantially similar to the core 305 in FIG. 3A, with the exception of there being additional pad widths. For example, third top pads $311_C$ and third bottom pads $312_C$ may have a different width than the first top pads $311_A$ and the first bottom pads $312_A$. Similarly, fourth top pads $311_D$ and fourth bottom pads $312_D$ may have different widths than the second top pads $311_B$ and the second bottom pads $312_B$. Although, not shown here pads like third top pads $311_C$ and corresponding third bottom pads $312_C$ can have different pad dimensions, such that third top pads $311_C$ and third bottom pads $312_C$ will create a third pitch.

Figure 3C:
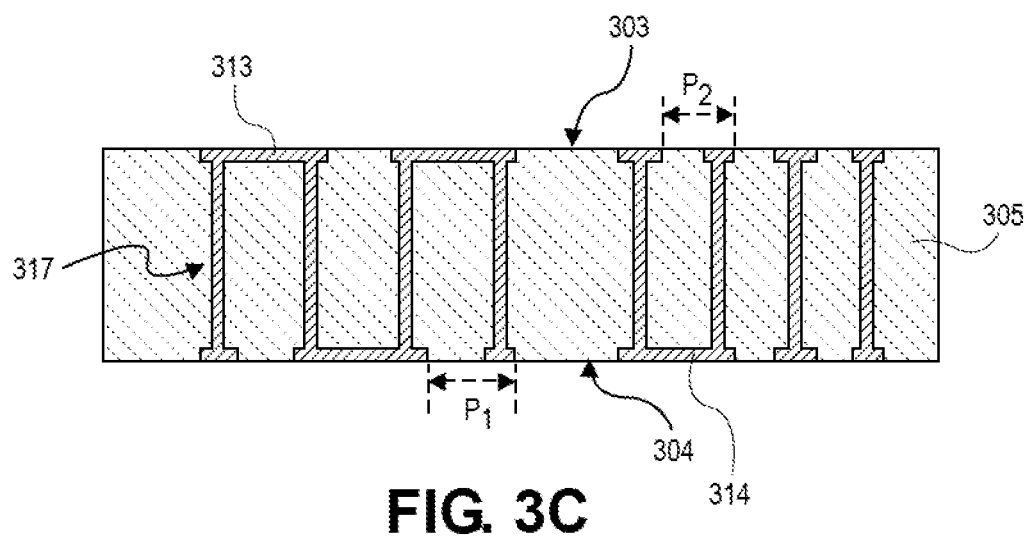
FIG. 3C is a cross-sectional illustration of a core with self-aligned vias that include daisy-chained interconnections, in accordance with an embodiment.

Referring now to FIG. 3C, a cross-sectional illustration of a package core 305 is shown, in accordance with an additional embodiment. In an embodiment, the core 305 in FIG. 3C may be substantially similar to the core 305 in FIG. 3A, with the exception of the vias 317 being daisy chained with each other. For example, embedded traces 313 (top) and 314 (bottom) may be used to connect adjacent vias together. In an embodiment, the traces 313 and 314 are embedded into the core 305 so that surfaces of the traces 313 and 314 are substantially coplanar with surfaces 303 and 304 of the core 305.

Referring now to FIGS. 4A-4J, a series of cross-sectional illustrations depicting a process for forming vias and pads using a laser assisted-etching process is shown, in accordance with an embodiment. In an embodiment, the patterning process may be referred to as a dual damascene process. The resulting structure includes pads that are self-aligned to the vias.

Figure 4A:
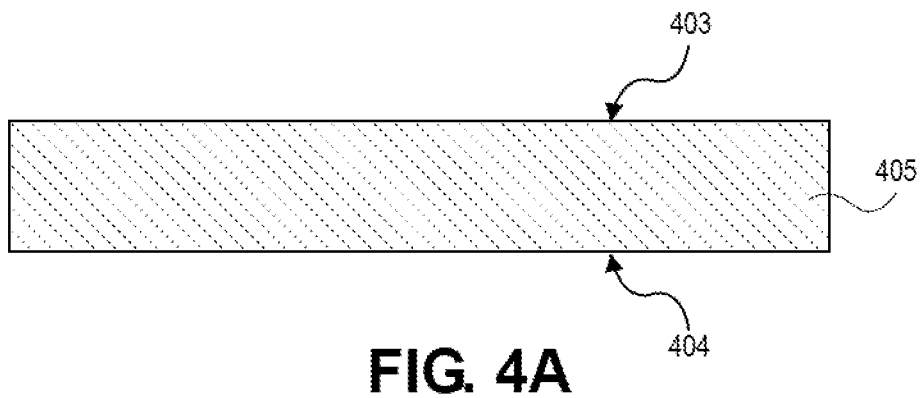
FIG. 4A is a cross-sectional illustration of an unpatterned core, in accordance with an embodiment.

Referring now to FIG. 4A, a cross-sectional illustration of a package core 405 is shown, in accordance with an embodiment. The core 405 may be a material that is susceptible to a change in morphology as a result of exposure to a laser. In an embodiment, the core 405 may be glass, ceramic, silicon, or other non-conductive semiconductor materials. In a particular embodiment, the core is glass, and the morphological change is a switch to a crystalline crystal structure from an amorphous crystal structure. In an embodiment, the core 405 may have a thickness between a first surface 403 and a second surface 404 that is between approximately 50 μm and approximately 1,000 μm.

Figure 4B:
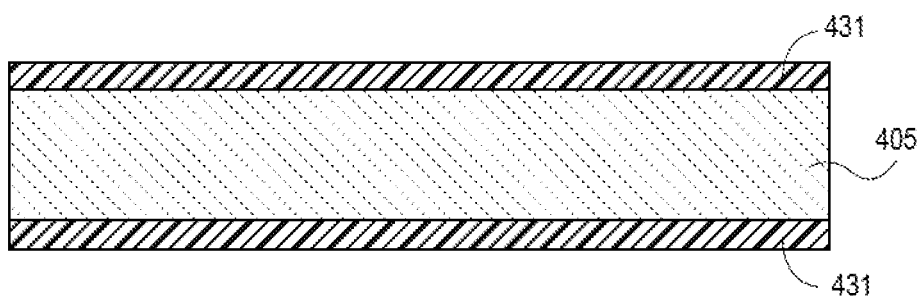
FIG. 4B is a cross-sectional illustration of the core with hardmask layers over a top and bottom surface of the core, in accordance with an embodiment.

Referring now to FIG. 4B, a cross-sectional illustration of the core 405 after hardmask layers 431 are disposed over the first surface 403 and the second surface 404 is shown, in accordance with an embodiment. In an embodiment, the hardmask layers 431 may be any suitable material for a hardmask, such as a metal mask or an organic mask. In an embodiment, the hardmask layers 431 may be deposited with any suitable deposition process (e.g., chemical vapor deposition (CVD), physical vapor deposition (PVD), spin coating, slit coating, lamination, or sputtering).

Figure 4C:
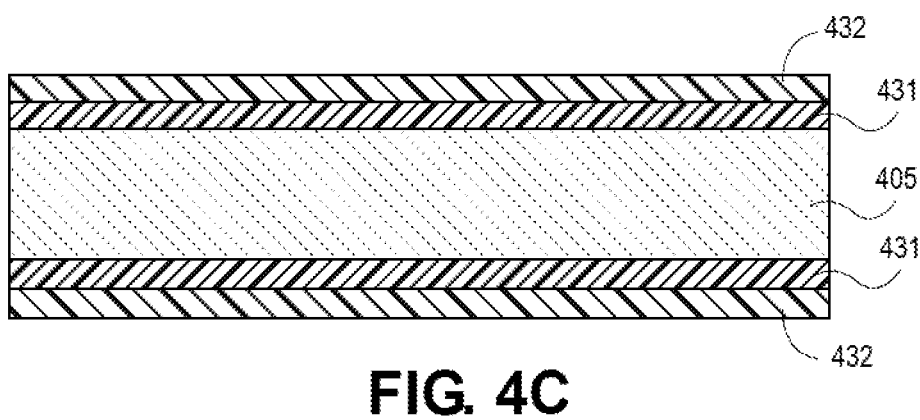
FIG. 4C is a cross-sectional illustration of the core after a photoresist is provided over the hardmask layers, in accordance with an embodiment.

Referring now to FIG. 4C, a cross-sectional illustration of the core 405 after a photoresist 432 is disposed over the hardmask layers 431 is shown, in accordance with an embodiment. The photoresist 432 may be any suitable photoresist material, and can be deposited with suitable methods, such as spin coating.

Figure 4D:
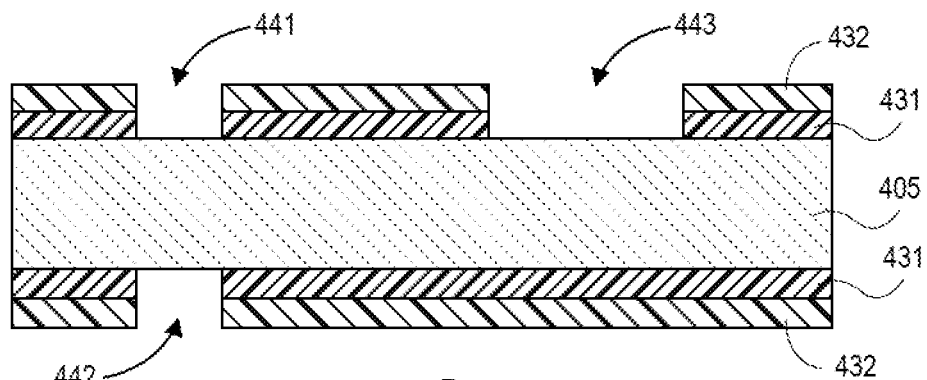
FIG. 4D is a cross-sectional illustration of the core after openings are patterned into the hardmask layers, in accordance with an embodiment.

Referring now to FIG. 4D, a cross-sectional illustration of the core 405 after openings 441, 442, and 443 are formed through the hardmask layers 431 is shown, in accordance with an embodiment. In an embodiment, the photoresist 432 may first be patterned with an exposure and developing process. The pattern may then be transferred into the hardmask layers 431 with an etching process. In an embodiment, openings 441 and 442 are aligned over each other, and opening 443 is offset from the openings 441 and 442. After formation of the openings 441, 442, and 443, the photoresist 432 may be stripped.

Figure 4E:
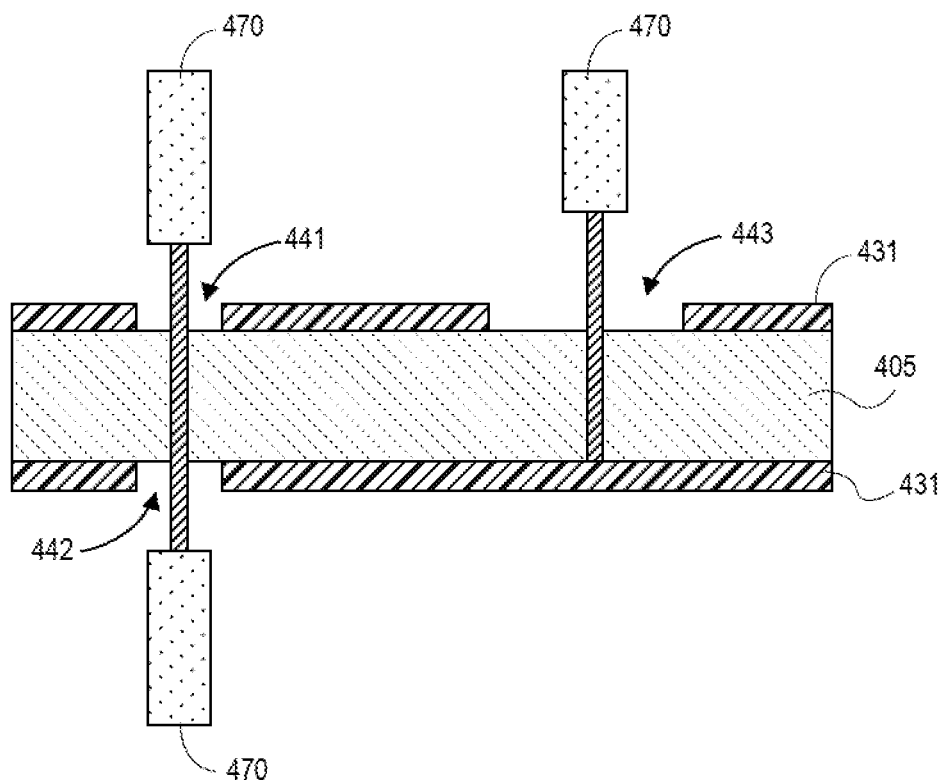
FIG. 4E is a cross-sectional illustration of a laser exposure of the core through the openings, in accordance with an embodiment.

Referring now to FIG. 4E, a cross-sectional illustration of the core 405 during a laser 470 exposure is shown, in accordance with an embodiment. In the illustrated embodiment, a double sided laser exposure is performed through openings 441 and 442. Opening 443 is exposed by a single laser in some embodiments.

Figure 4F:
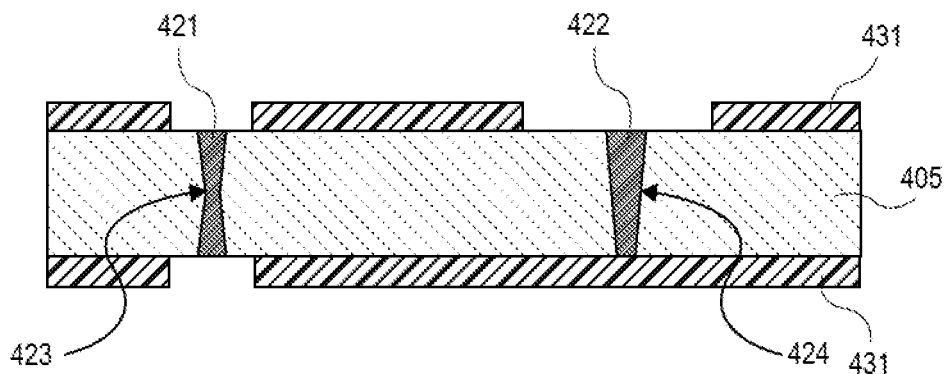
FIG. 4F is a cross-sectional illustration of the core with exposed regions that have undergone a morphological change as a result of the laser exposure, in accordance with an embodiment.

Referring now to FIG. 4F, a cross-sectional illustration of the core 405 after the laser exposure is shown, in accordance with an embodiment. Exposed regions 421 and 422 are shown. The exposed region 421 may be provided between openings 441 and 442, and the exposed region 422 is provided below opening 443. In an embodiment where the core 405 is glass, the exposed regions 421 and 422 may have a crystalline configuration, and the remainder of the core 405 may have an amorphous configuration. In an embodiment, the sidewalls 423 of the exposed region 421 and the sidewalls 424 of the exposed region 422 may be sloped. Due to the dual sided exposure of the exposed region 421, the exposed region 421 may have an hourglass shaped cross-section.

Figure 4G:
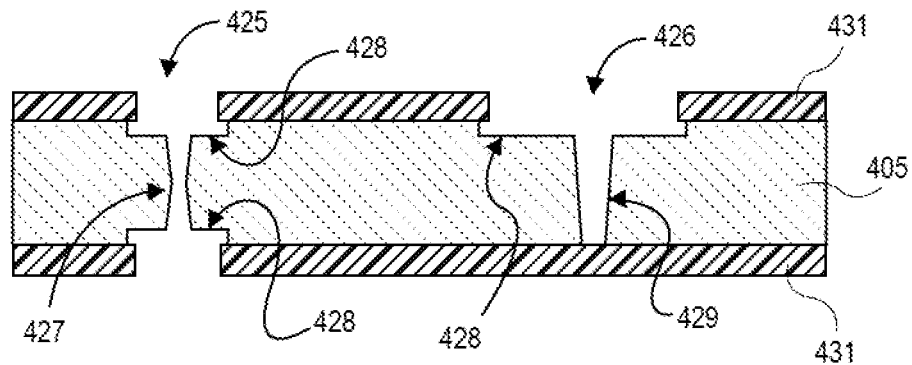
FIG. 4G is a cross-sectional illustration of the core after an etching process forms via holes with recesses for pads, in accordance with an embodiment.

Referring now to FIG. 4G, a cross-sectional illustration of the core 405 after an etching process is shown, in accordance with an embodiment. In an embodiment, the etching process is a wet etching process. It should be noted, that the etching process can also include a dry etching process either before or after laser patterning, to help induce better selectivity between exposed core regions and unexposed core. The etching process provides holes 425 and 426 through the core 405. In an embodiment, the etching process may have an etch selectivity to the exposed regions that is 3:1 or greater, or 50:1 or greater. As such, the exposed regions are rapidly etched while the remainder of the core 405 is recessed slowly. In an embodiment, hole 425 may comprise a via hole 427 and pad recesses 428. The pad recesses 428 are on both ends of the via hole 427 since there is an opening through the hardmask on each side. In an embodiment, hole 426 may comprise a via hole 429 with a pad recess 428. Only a single pad recess 428 is provided in hole 426 because the bottom side is blocked by the hardmask 431.

It is to be appreciated that the pad recesses 428 are self-aligned with the via holes 427 and 429. This is because the exposed regions 423 and 424 are formed through the openings 441, 442, 443. Accordingly, only a single lithographic step is needed in order to form the pad recesses 428 and the via holes 427 and 429. Self-aligned features allow for tighter pitches since alignment tolerances are reduced or eliminated. For example, pitches between features in the core 405 may be approximately 100 μm or less, approximately 50 µm or less, or even approximately 10 µm or less. This is a significant improvement compared to existing plated through hole (PTH) architectures with organic cores that require pitches of approximately 100 µm or greater.

Figure 4H:
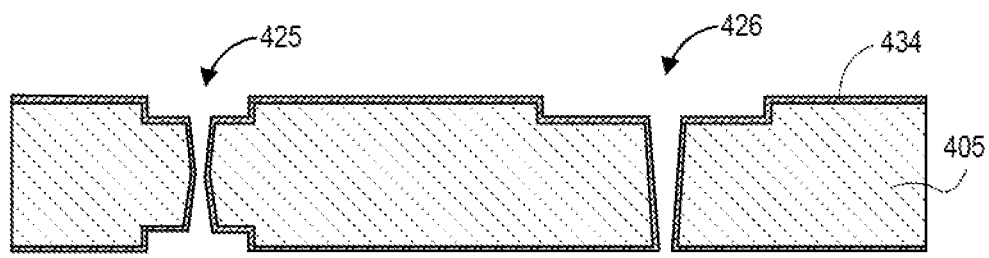
FIG. 4H is a cross-sectional illustration of the core after a seed layer is deposited over the core, in accordance with an embodiment.

Referring now to FIG. 4H, a cross-sectional illustration of the core 405 after the hardmask 431 is removed and a seed layer 434 is disposed over exposed surfaces of the core 405 is shown, in accordance with an embodiment. In an embodiment, the seed layer 434 may be a copper seed layer or the like.

Figure 4I:
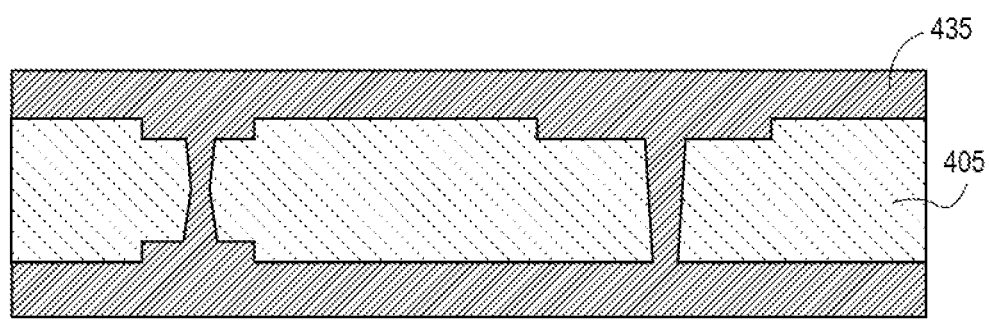
FIG. 4I is a cross-sectional illustration of the core after a conductive metal is plated into the openings, in accordance with an embodiment.

Referring now to FIG. 4I, a cross-sectional illustration of the core 405 after a plating process is shown, in accordance with an embodiment. The plating of a conductive material 435 may be copper or the like. As shown, the conductive material 435 fills the via holes and the pad recesses.

Figure 4J:
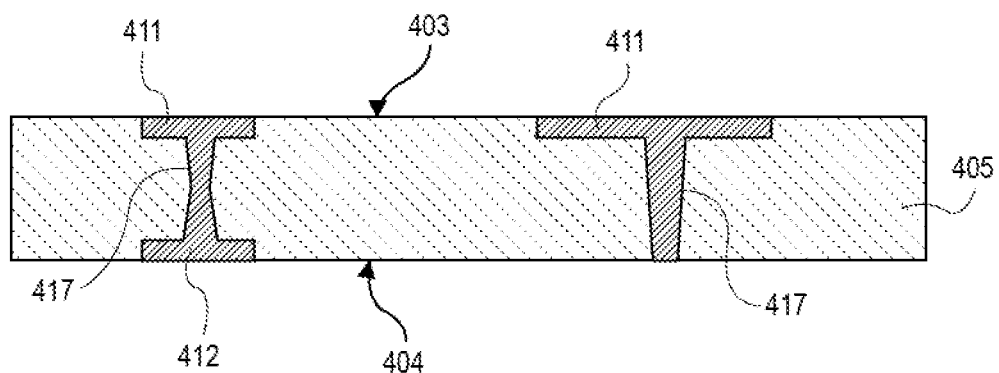
FIG. 4J is a cross-sectional illustration of the core after a polishing process recesses the conductive metal to define a plurality of pads, in accordance with an embodiment.

Referring now to FIG. 4J, a cross-sectional illustration of the core 405 after a recessing process is shown, in accordance with an embodiment. In an embodiment, the recessing process may comprise a chemical mechanical planarization (CMP) process or the like. The overburden of the conductive material 435 is removed to isolate conductive vias 417 and pads 411/412. As shown, the pads 411 are embedded with a surface substantially coplanar with a first surface 403 of the core 405, and the pads 412 are embedded with a surface substantially coplanar with a second surface 404 of the core 405. In the illustrated embodiment, pads 411/412 are shown, but it is to be appreciated that redistribution traces may also be embedded in the core 405 using similar patterning processes. That is, a shape of the redistribution trace may be provided into the hardmask and transferred into the core 405 during the wet etching process.

Figure 5B:
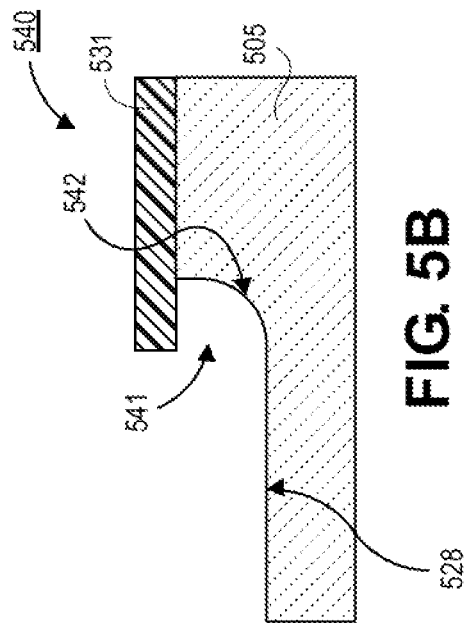
FIG. 5B is a zoomed in illustration of FIG. 5A that more clearly illustrates the presence of an undercut below the hardmask opening, in accordance with an embodiment.
Figure 5C:
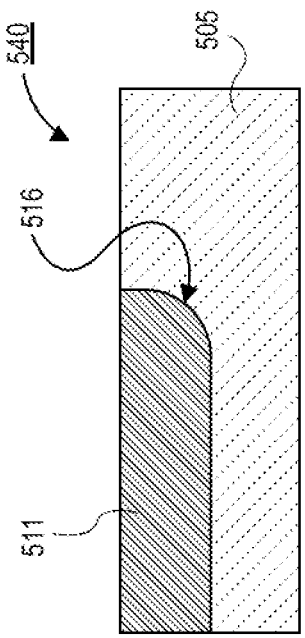
FIG. 5C is a cross-sectional illustration of a pad recessed into the core with a rounded corner, in accordance with an embodiment.

It is to be appreciated that there may be residual artifacts left in the final structure, as a result of the process described above. Particularly, the shape of the embedded pads may be used to identify the use of the previous process. Examples of such an artifact are shown in FIGS. 5A-5C.

Figure 5A:
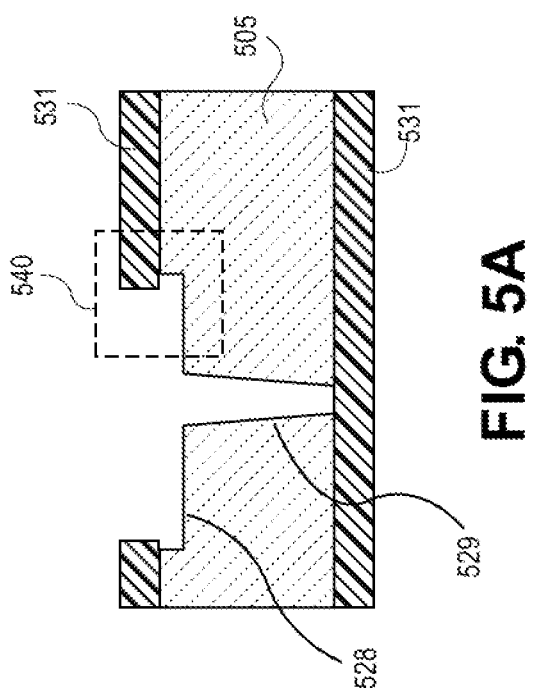
FIG. 5A is a cross-sectional illustration of a via opening formed in the core, in accordance with an embodiment.

Referring now to FIG. 5A, a cross-sectional illustration of a portion of the core 505 is shown, in accordance with an embodiment. As shown, hardmasks 531 are over the core 505, and a via hole 529 and pad recess 528 are provided. A region 540 is highlighted by a dashed box. The region 540 is shown in greater detail in FIG. 5B. As shown, the pad recess 528 has an undercut 541 below the hardmask 531. Additionally, a corner 542 of the pad recess 528 (i.e., at the transition between a bottom surface of the pad recess 528 and a sidewall surface of the recess 528) is rounded. The undercut 541 and the rounding of the corner 542 is the result of the anisotropic wet etching process. Referring now to FIG. 5C, a cross-sectional illustration of the region 540 after plating 511 is shown, in accordance with an embodiment. As shown, the corner 516 may be rounded in the final structure.

Figure 6A:
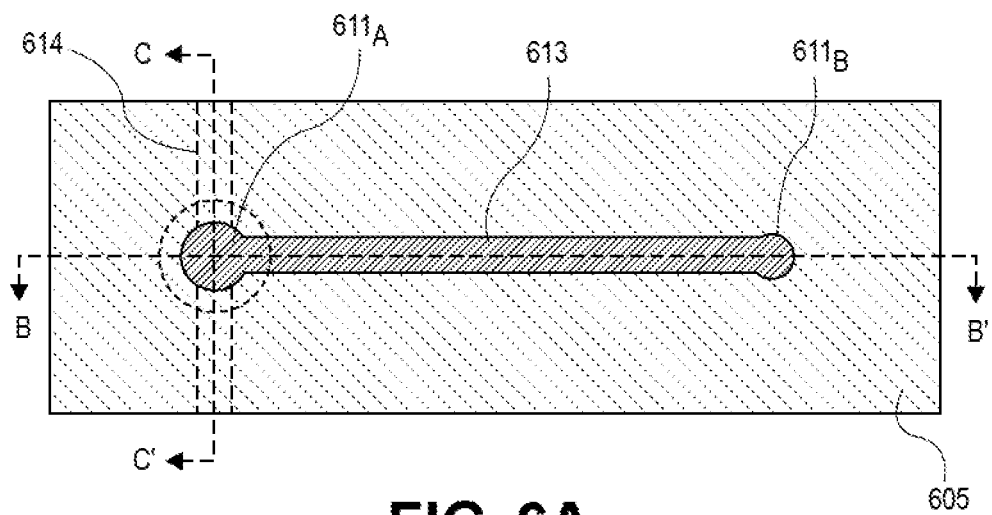
FIG. 6A is a plan view illustration of a core with conductive routing formed with a dual damascene process, in accordance with an embodiment.
Figure 6B:
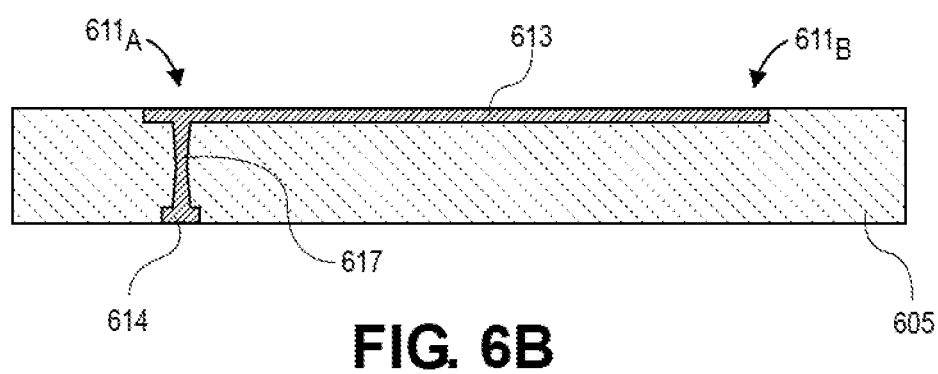
FIG. 6B is a cross-sectional illustration of the core in FIG. 6A along line B-B', in accordance with an embodiment.
Figure 6C:
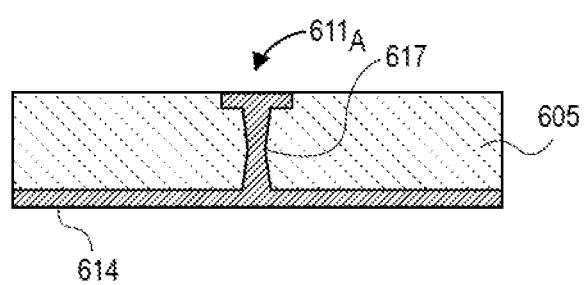
FIG. 6C is a cross-sectional illustration of the core in FIG. 6A along line C-C', in accordance with an embodiment.

Referring now to FIGS. 6A-6C, a series of illustrations depicting the resulting structure formed using a dual damascene process is shown, in accordance with an embodiment. In FIG. 6A, a plan view illustration of the core 605 is shown, in accordance with an embodiment. As shown, a first pad $611_A$ is coupled to a second pad $611_B$ by a trace 613. The first pad $611_A$ and the second pad $611_B$ may have different diameters. However, it is to be appreciated that the first pad $611_A$ and the second pad $611_B$ may have similar diameters in some embodiments. As shown with the dashed lines, a trace 614 may be provided on the opposite surface of the core 605.

Referring now to FIG. 6B, a cross-sectional illustration of the core 605 in FIG. 6A along line B-B' is shown, in accordance with an embodiment. In an embodiment, a via 617 connects the first pad $611_A$ to the trace 614. In the illustrated embodiment, the via 617 is a fully filled via. However, in other embodiments, a via 617 may be a PTH via. Referring now to FIG. 6C, a cross-sectional illustration of the core 605 in FIG. 6A along line C-C' is shown, in accordance with an embodiment. As shown in FIG. 6C, the via 617 lands on the trace 614 without the need for a pad. As such, even smaller pitches are possible.

Figure 7A:
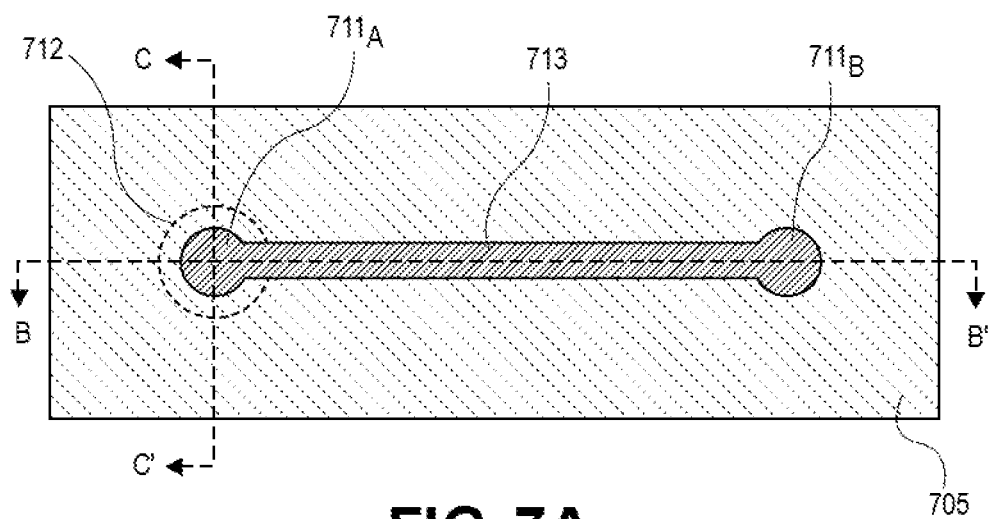
FIG. 7A is a plan view illustration of a core with conductive routing formed with a dual damascene process, in accordance with an additional embodiment.
Figure 7B:
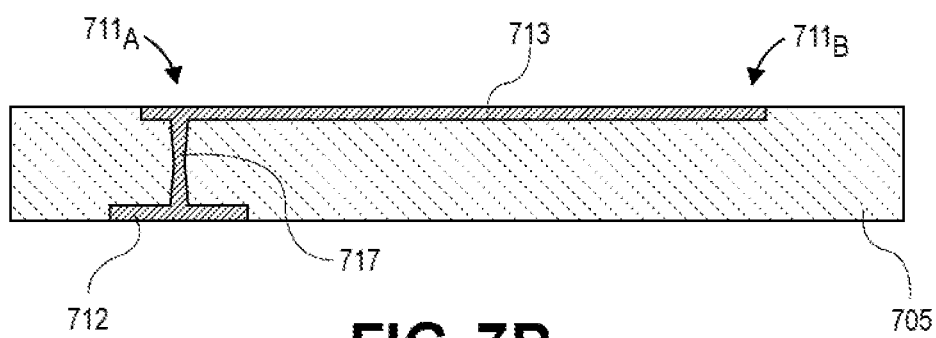
FIG. 7B is a cross-sectional illustration of the core in FIG. 7A along line B-B', in accordance with an embodiment.
Figure 7C:
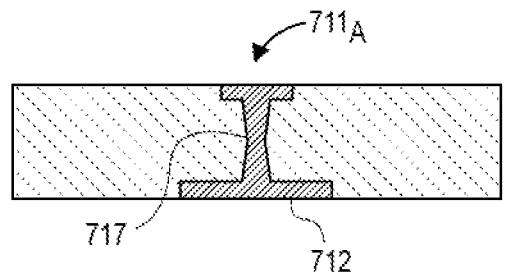
FIG. 7C is a cross-sectional illustration of the core in FIG. 7A along line C-C', in accordance with an embodiment.

Referring now to FIGS. 7A-7C, a series of illustrations depicting a core 705 is shown, in accordance with an additional embodiment. In FIG. 7A, a top view illustration of the core 705 is shown, in accordance with an embodiment. The core 705 may comprise a first pad $711_A$ that is connected to a second pad $711_B$ by a trace 713. As shown in FIG. 7B, the first pad $711_A$, the second pad $711_B$, and the trace 713 may be embedded into the core 705. As shown in FIG. 7C, a via 717 may connect the first pad $711_A$ to an underlying pad 712 on the opposite side of the core 705. The underlying pad 712 may also be embedded in the core 705. In the illustrated embodiment, the via 717 is a fully filled via. However, it is to be appreciated that the via 717 may also have a PTH architecture in some embodiments.

Figure 8A:
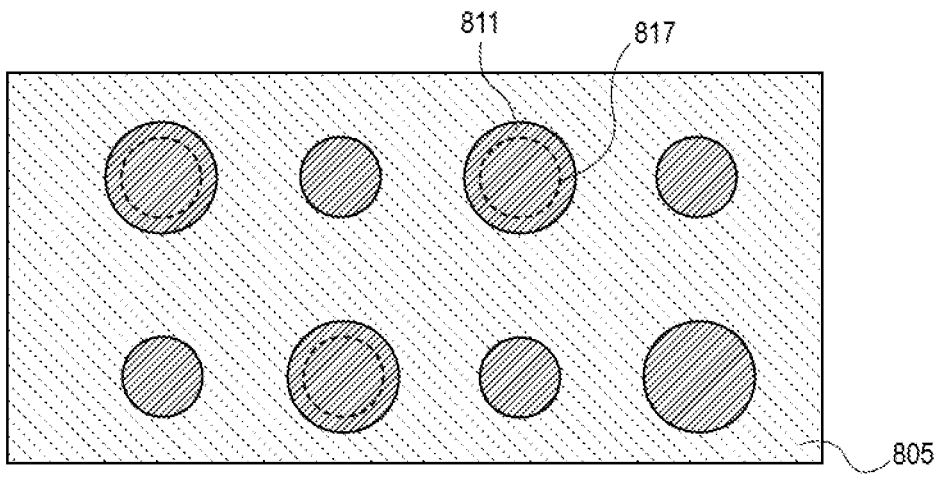
FIG. 8A is a plan view illustration of a core with circular pads and underlying vias that are circular, in accordance with an embodiment.
Figure 8B:
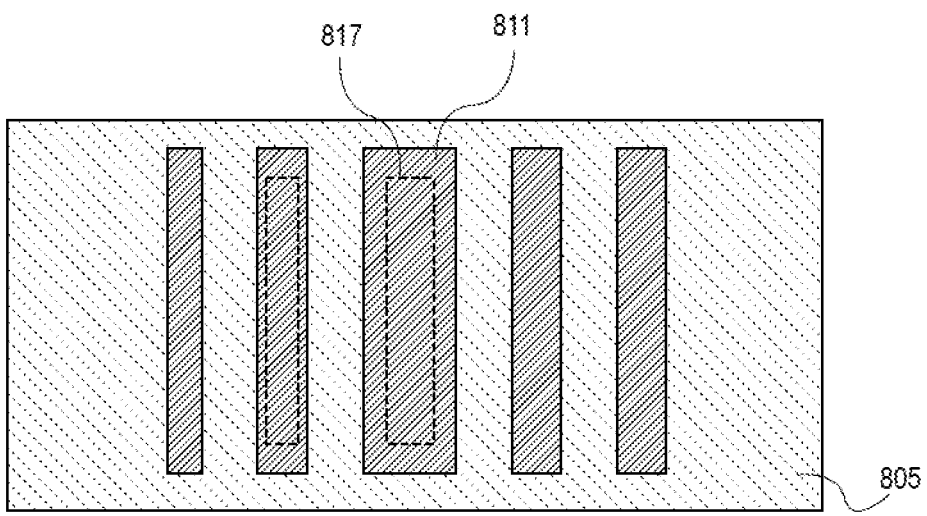
FIG. 8B is a plan view illustration of a core with elongated pads and via planes below the pads, in accordance with an embodiment.
Figure 8C:
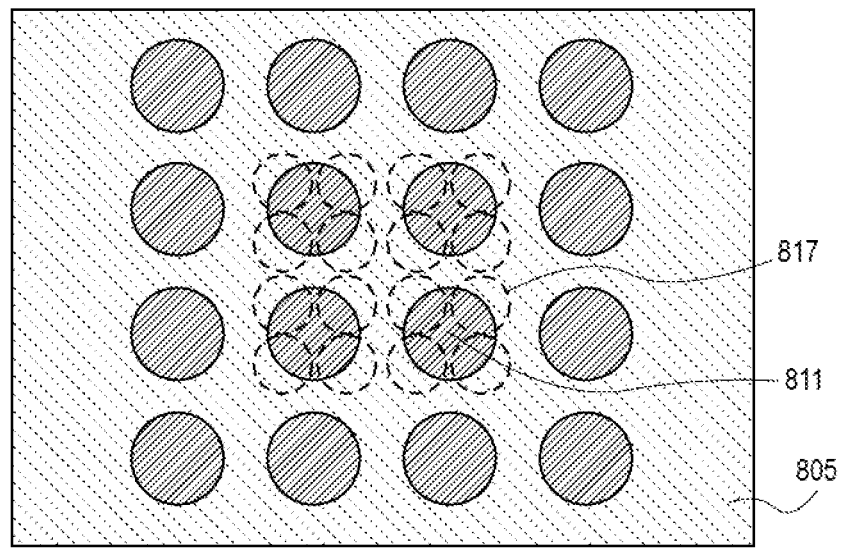
FIG. 8C is a plan view illustration of a core with circular pads and a plurality of vias coupled to individual ones of the circular pads, in accordance with an embodiment.

Referring now to FIGS. 8A-8C, a series of plan view illustrations depicting pad and via architectures is shown, in accordance with an embodiment. In FIG. 8A, a plurality of circular pads 811 on the core 805 are shown. As indicated with the dashed lines, vias 817 may be provided through the core 805. In FIG. 8B, rectangular pads 811 are shown. In an embodiment via planes 817 are provided below several of the pads 811. A via plane 817 refers to a via that has a length dimension that is substantially greater than a width dimension. Such via planes 817 are able to be fabricated by the laser-assisted etching process by scanning the laser in the length direction during the laser exposure process. As shown in FIG. 8C, a plurality of vias 817 may be provided to an individual pad 811. The grouping of vias 817 is made possible by the fine pitch and feature size enabled by the laser-assisted etching process.

Embodiments disclosed herein also allow for plating vias with large aspect ratios. Whereas existing deposition processes are limited to aspect ratios of approximately 6:1 or lower, embodiments disclosed herein allow for plating vias with aspect ratios of 6:1 or greater, or even 10:1 or greater. Particularly, embodiments include the use of a perforated ledge that is inserted along the length of the via hole. The perforated ledge provides a surface onto which the metal can be deposited in order to fabricate high aspect ratio vias with electrolytic plating processes.

Figure 9A:
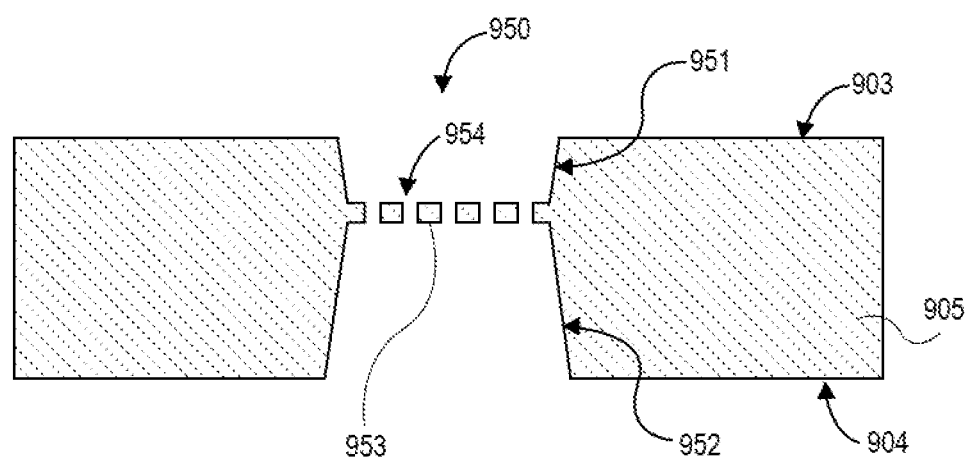
FIG. 9A is a cross-sectional illustration of a core with a via opening that comprises a first portion, a second portion, and a perforated ledge between the first portion and the second portion, in accordance with an embodiment.

Referring now to FIG. 9A, a cross-sectional illustration of a core 905 is shown, in accordance with an embodiment. In an embodiment, a via hole 950 is provided into the core 905. The via hole 950 may have an aspect ratio (depth:width) that is approximately 6:1 or greater, or approximately 10:1 or greater. In an embodiment, the via hole 950 may comprise a first portion 951, a second portion 952, and a perforated ledge 953 between the first portion 951 and the second portion 952. In an embodiment, the perforated ledge 953 may have a thickness that is approximately 20 µm or smaller, approximately 10 µm or smaller, or approximately 5 µm or smaller.

Small thicknesses of the perforated ledge 953 are made possible by the laser-assisted etching process used to form the via hole 950. A first laser exposure may be controlled to a precise depth to form the first portion 951, and a second laser exposure may be controlled to a precise depth to form the second portion 952 on the opposite side. The accuracy of the blind features provided by the laser exposure allows for small thicknesses of the perforated ledge 953. The perforations 954 may also be formed by a laser exposure and etching process.

In an embodiment, the perforated ledge 953 may be at a midpoint between a first surface 903 and a second surface 904 of the core 905. That is, the first portion 951 and the second portion 952 may have substantially equal depths. In other embodiments, the perforated ledge 953 may be closer to one surface of the core 905. For example, in FIG. 9A, the perforated ledge 953 is closer to the first surface 903. As such, the depth of the first portion 951 is smaller than a depth of the second portion 952. This ensures that the first portion 951 has an aspect ratio that can be fully plated with an adhesion layer and the seed layer, as will be described in greater detail below.

Figure 9B:
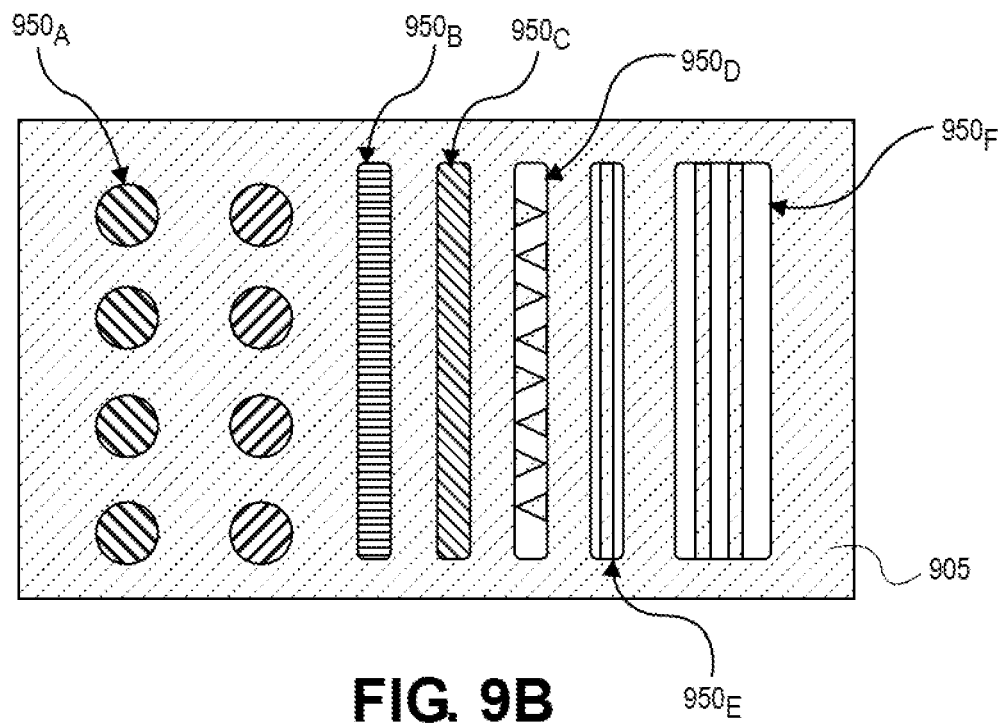
FIG. 9B is a plan view illustration showing a plurality of different perforation patterns that may be used, in accordance with an embodiment.

Referring now to FIG. 9B, a plan view illustration of a plurality of different via holes 950$_A$-950$_F$ are shown. The via holes 950$_A$ may be circular vias with horizontal perforations. The via holes 950$_B$-950$_F$ may be via planes with various perforation types. For example, various line patterns are used to form the perforations in via holes 950$_B$, 950$_C$, 950$_E$, and 950$_F$, and triangular patterns are used to form the perforations in via hole 950$_D$. While several examples of via hole 950 shapes and perforation patterns are shown, it is to be appreciated that the via hole 950 shapes and perforation patterns can be any suitable shapes or patterns, depending on the desired architecture.

Referring now to FIGS. 10A-10F, a series of cross-sectional illustrations depicting a process of forming a via with the use of a perforated ledge is shown, in accordance with an embodiment.

Figure 10A:
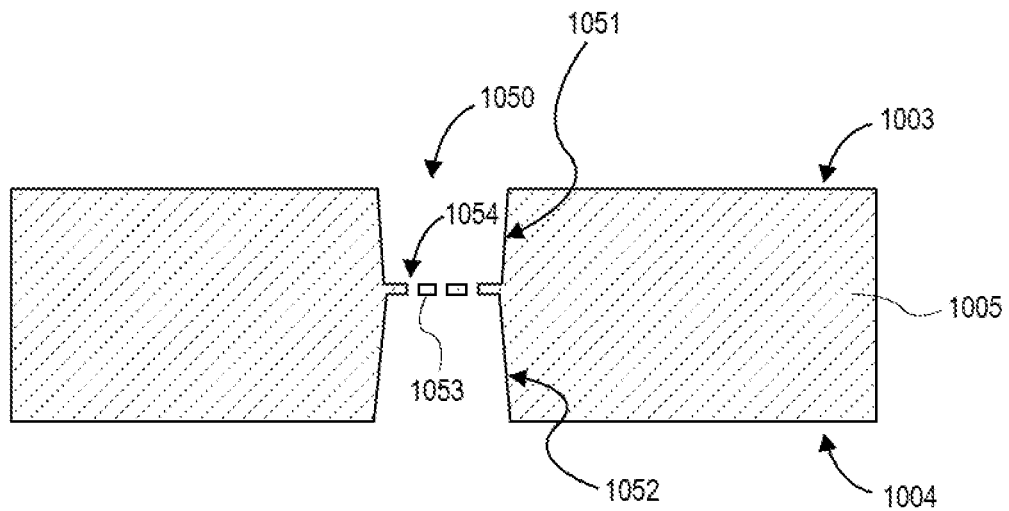
FIG. 10A is a cross-sectional illustration of a core with a via opening that comprises a first portion, a second portion, and a perforated ledge between the first portion and the second portion, in accordance with an embodiment.

Referring now to FIG. 10A, a cross-sectional illustration of a core 1005 is shown, in accordance with an embodiment. In an embodiment, the core 1005 comprises a first surface 1003 and a second surface 1004 opposite from the first surface 1003. In an embodiment, a via hole 1050 is formed through the core 1005. The via hole 1050 comprises a first portion 1051 into the first surface 1003, a second portion 1052 into the second surface 1004, and a perforated ledge 1053 between the first portion 1051 and the second portion 1052. Perforations 1054 may pass through the perforated ledge 1053 to connect the first portion 1051 to the second portion 1052. In an embodiment, the perforated ledge 1053 is closer to the first surface 1003 than the second surface 1004.

Figure 10B:
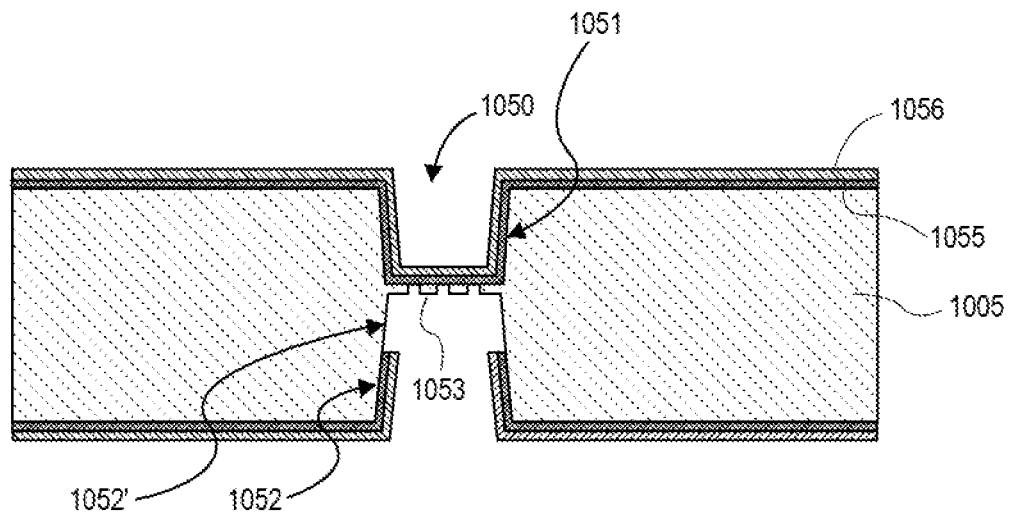
FIG. 10B is a cross-sectional illustration of the core after an adhesion layer and a seed layer are disposed over the core, in accordance with an embodiment.

Referring now to FIG. 10B, a cross-sectional illustration of the core 1005 after an adhesion layer 1055 and a seed layer 1056 are deposited onto exposed surfaces of the core 1005 is shown, in accordance with an embodiment. In an embodiment, the adhesion layer 1055 and the seed layer 1056 may be deposited with a PVD or sputtering process. For example, the adhesion layer 1055 may comprise titanium, and the seed layer 1056 may comprise copper. As shown, the deposition on the first surface 1003 results in a complete coverage of the first portion 1051 of the via hole 1050. This is because the perforated ledge 1053 serves as a ledge to reduce the aspect ratio (e.g., to approximately 6:1 or lower, or approximately 3:1 or lower) to be within the capabilities of existing sputtering or PVD tools. While shown as fully covered by the adhesion layer 1055 and the seed layer 1056, in some embodiments, perforations 1054 may continue through the adhesion layer 1055 and the seed layer 1056 in some embodiments.

On the opposite side of the core 1005, the PVD or sputtering deposition does not completely line the second portion 1052 of the via hole 1050. That is, the region 1052' of the second portion 1052 proximate to the perforated ledge 1053 is free from the adhesion layer 1055 and the seed layer 1056. The gap may be attributable to the increased aspect ratio formed in the second portion 1052 since the perforated ledge 1053 is closer to the first surface 1003 than to the second surface 1004.

Figure 10C:
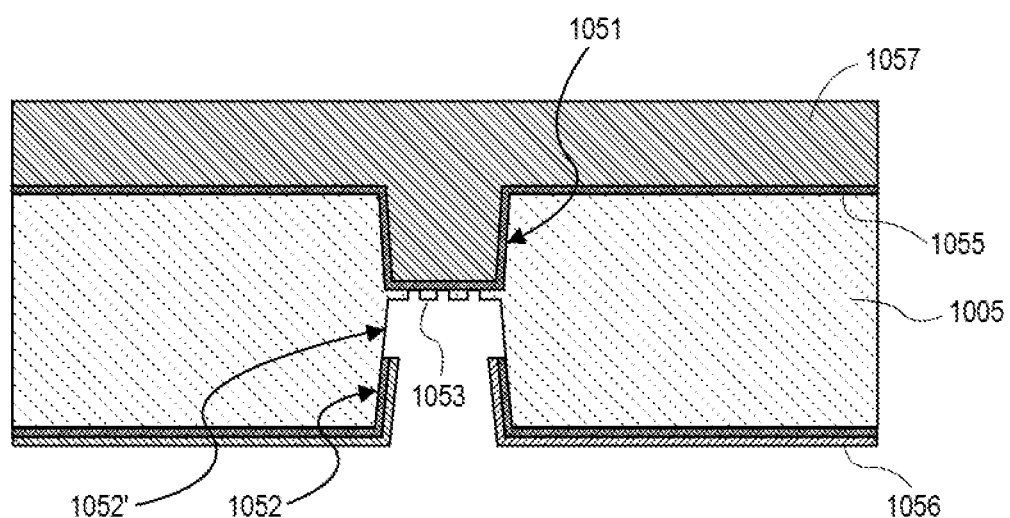
FIG. 10C is a cross-sectional illustration of the core after metal is plated into the first portion of the via opening, in accordance with an embodiment.

Referring now to FIG. 10C, a cross-sectional illustration of the core 1005 after a first plating process is implemented is shown, in accordance with an embodiment. In an embodiment, the first plating process results in the plating of a metal 1057 (e.g., copper) into the first portion 1051 of the via hole 1050. The entire first portion 1051 is plated due to the lower aspect ratio and uniform coating of the seed layer 1056 and adhesion layer 1055. The first plating process may be an electrolytic plating process.

Figure 10D:
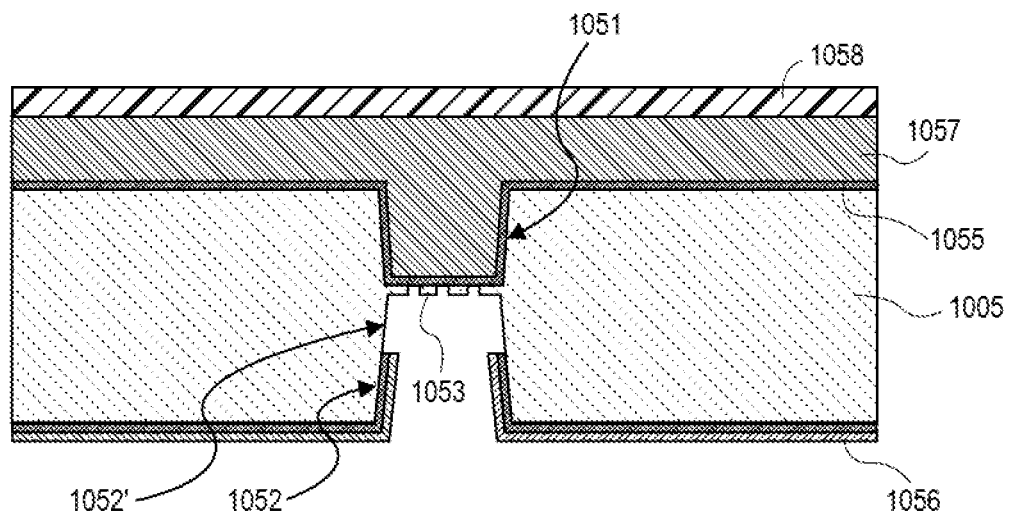
FIG. 10D is a cross-sectional illustration of the core after a mask layer is provided over the metal, in accordance with an embodiment.

Referring now to FIG. 10D, a cross-sectional illustration of the core 1005 after a mask layer 1058 is disposed over the metal 1057 is shown, in accordance with an embodiment. The mask layer 1058 prevents further metal deposition onto the first side of the core 1005 during deposition of metal onto the backside of the core 1005.

Figure 10E:
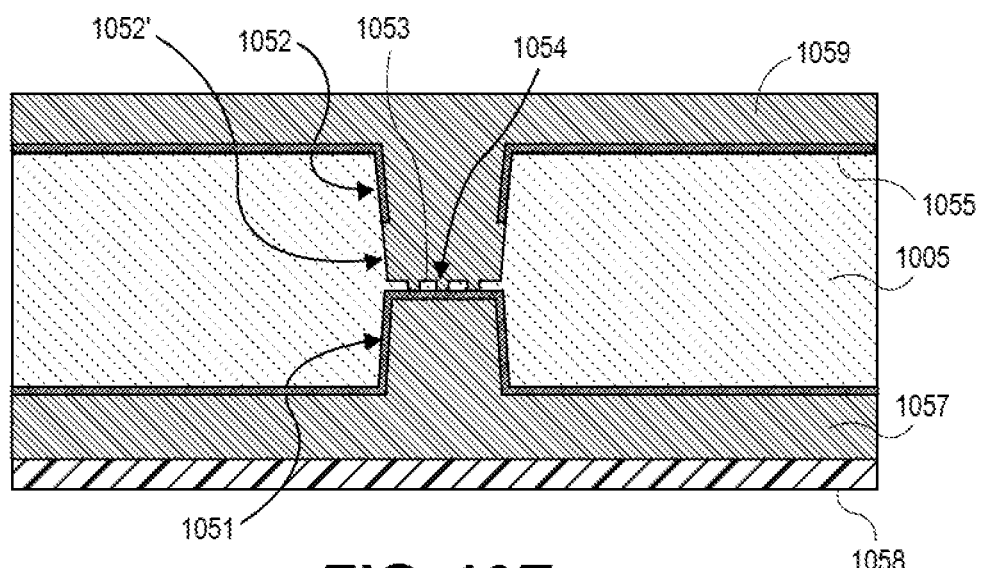
FIG. 10E is a cross-sectional illustration of the core after metal is plated into the second portion of the via opening, in accordance with an embodiment.

Referring now to FIG. 10E, a cross-sectional illustration of the core 1005 after a second metal layer 1059 is plated onto the backside surface of the core 1005. The plating process may be an electrolytic plating process. At the beginning of the plating process, the metal 1059 grows bottom up from the perforations 1054 since region 1052' prevents a continuous conductive connection to the adhesion layer 1055 and the seed layer 1056 on the second portion 1052. After growth up to the adhesion layer 1055 and the seed layer 1056, a conductive connection is made between the two surfaces, and the metal layer 1059 may uniformly plate across the remainder of the seed layer 1056.

Figure 10F:
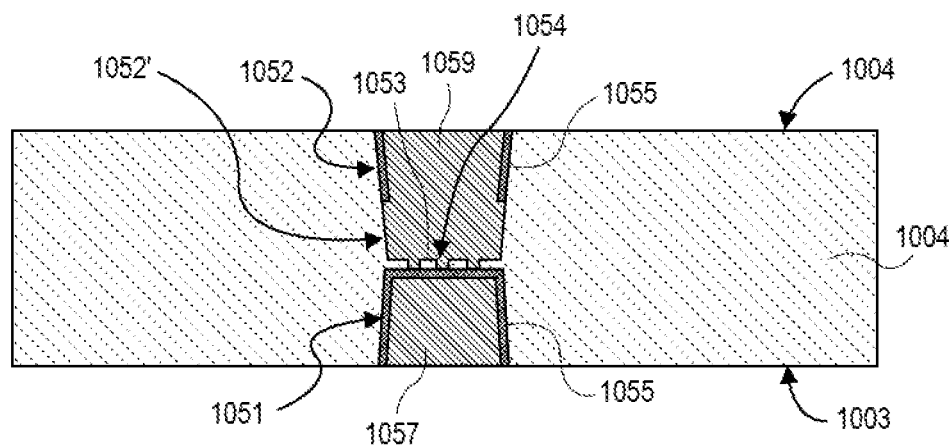
FIG. 10F is a cross-sectional illustration of the core after polishing is implemented to define the via through the via hole, in accordance with an embodiment.

Referring now to FIG. 10F, a cross-sectional illustration of the core 1005 after a polishing process is shown, in accordance with an embodiment. As shown, the metal 1057 and 1059 may be recessed to define a via through the via hole. The via includes a first portion 1051 that is entirely lined with an adhesion layer 1055, and a second portion 1052 that is partially lined with an adhesion layer 1055. That is, a gap region 1052' may be provided in the second portion 1052.

Referring now to FIGS. 11A-11D, a series of cross-sectional illustrations depicting a process for forming a via using a perforated ledge, where the perforated ledge is removed from the final structure is shown, in accordance with an embodiment.

Figure 11A:
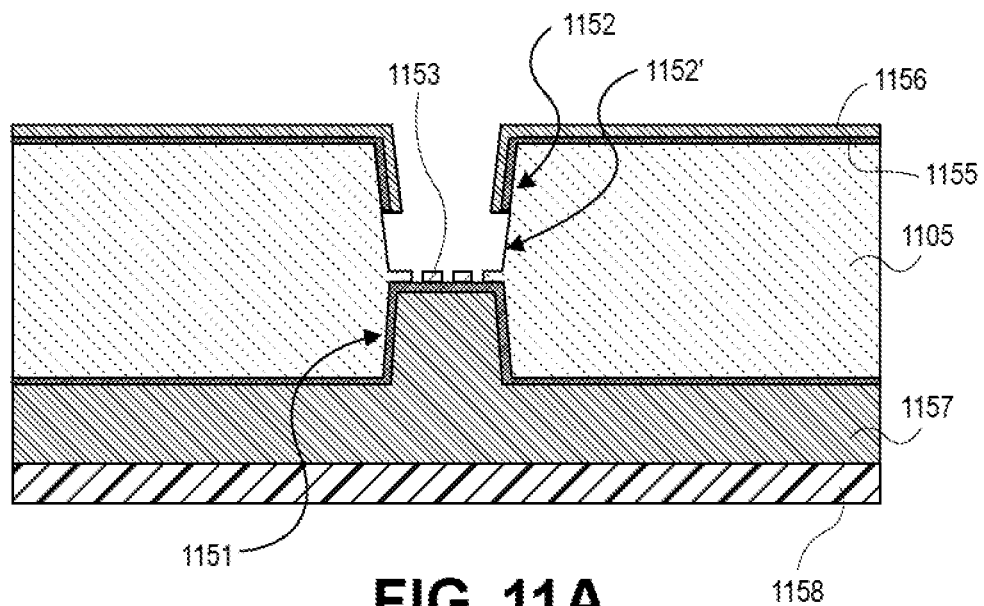
FIG. 11A is a cross-sectional illustration of a core with a metal filling a first portion of the via opening, in accordance with an embodiment.

Referring now to FIG. 11A, a cross-sectional illustration of a core 1105 at a state of manufacture is shown, in accordance with an embodiment. The core 1105 may comprise a via hole with a first portion 1151, a second portion 1152, and a perforated ledge 1153. An adhesion layer 1155 and a seed layer 1156 may be deposited over exposed surfaces of the core 1105. In an embodiment, a region 1152' of the second portion 1152 is not coated by the adhesion layer 1155 and the seed layer 1156. In the state of manufacture shown in FIG. 11A, a first metal layer 1157 is deposited in the first portion 1151 and a mask 1158 is provided over the metal layer 1157. The structure in FIG. 11A may be manufactured using processes similar to those described above with respect to FIGS. 10A-10D.

Figure 11B:
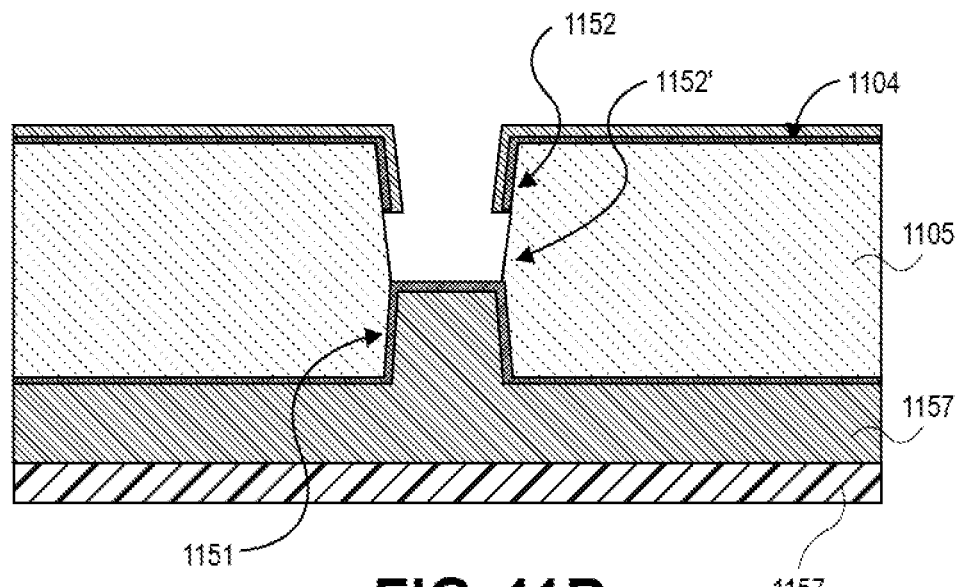
FIG. 11B is a cross-sectional illustration of the core after the perforated ledge is removed is shown, in accordance with an embodiment.

Referring now to FIG. 11B, a cross-sectional illustration of the core 1105 after the perforated ledge 1153 is removed is shown, in accordance with an embodiment. In an embodiment, the perforated ledge 1153 may be removed with an etching process. The adhesion layer 1155 may remain as an indication that a perforated ledge 1153 was formed at one point in the process flow. Though it is to be appreciated that perforations may be formed through the adhesion layer to allow for bottom-up plating from the underlying first metal layer 1157. In an alternative embodiment, the adhesion layer 1155 may be entirely removed to directly grow from the first metal layer 1157.

Figure 11C:
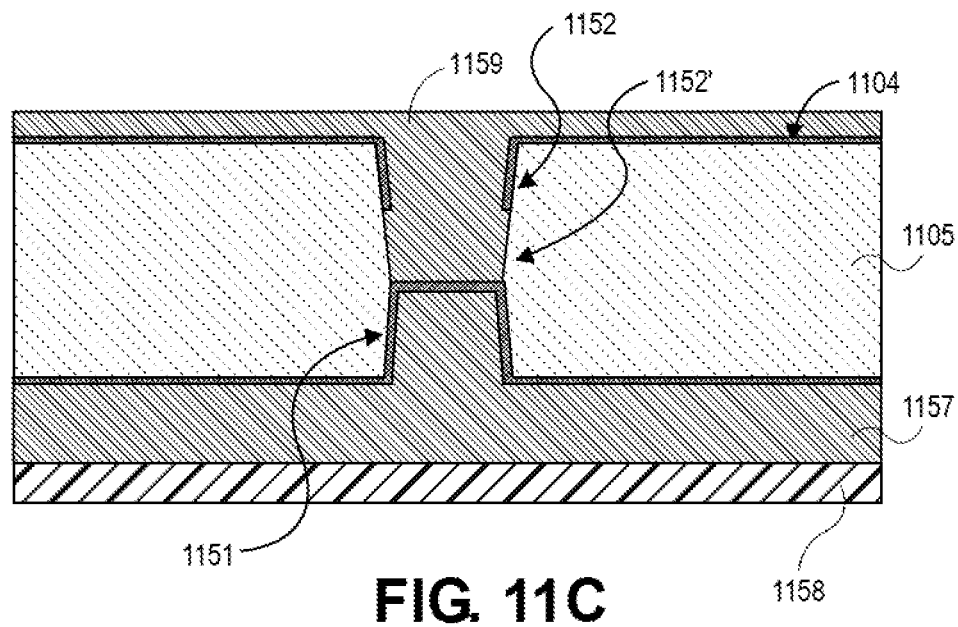
FIG. 11C is a cross-sectional illustration of the core after metal is plated into the second portion of the via opening, in accordance with an embodiment.

Referring now to FIG. 11C, a cross-sectional illustration of the core 1105 after a metal layer 1159 is formed in the second portion 1152 is shown, in accordance with an embodiment. Similar to the embodiment described above, the metal layer 1159 may grow from the bottom up from the adhesion layer 1155 until the metal layer 1159 passes the region 1152' and connects to the remainder of the adhesion layer 1155 and the seed layer 1156 on the backside of the core 1105. At that point, the electrolytic plating may begin growing across the entire backside surface.

Figure 11D:
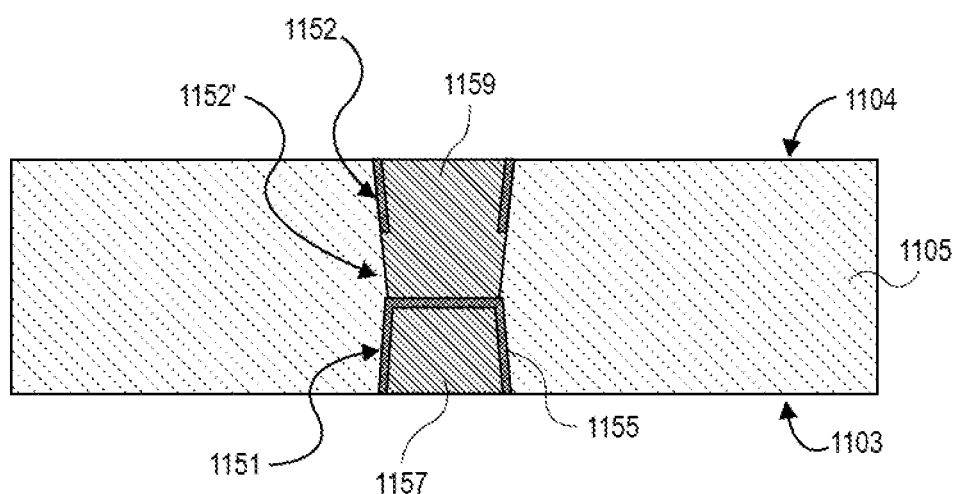
FIG. 11D is a cross-sectional illustration of the core after polishing is implemented to defined the via through the via hole, in accordance with an embodiment.

Referring now to FIG. 11D a cross-sectional illustration of the core 1105 after a polishing process is shown, in accordance with an embodiment. As shown, the metal 1157 and 1159 may be recessed to define a via through the via hole. The via includes a first portion 1151 that is entirely lined with an adhesion layer 1155, and a second portion 1152 that is partially lined with an adhesion layer 1155. That is, a gap region 1152' may be provided in the second portion 1152.

In addition to providing conductive via structures through the core, perforated ledge architectures may be used in the assembly of other structures. For example, capacitors, batteries, and magnetic switches may be fabricated using perforated ledge architectures. Examples of such embodiments are shown in FIGS. 12A-12C.

Figure 12A:
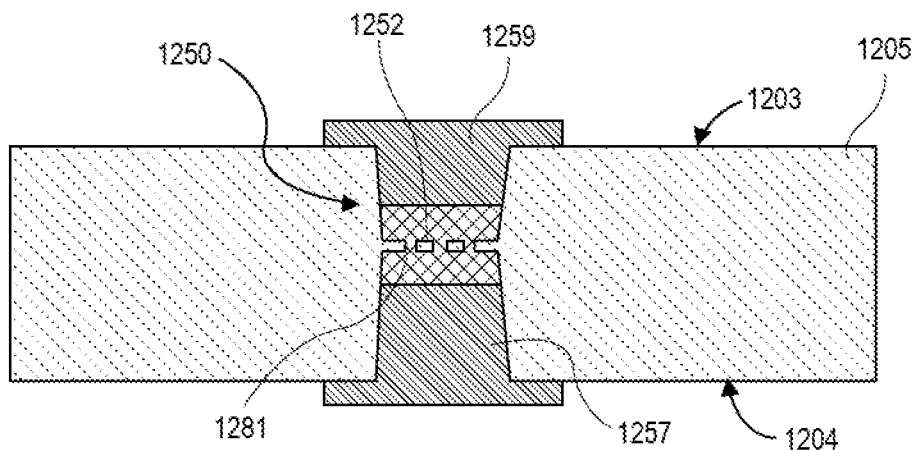
FIG. 12A is a cross-sectional illustration of a capacitor device with a perforated ledge, in accordance with an embodiment.

Referring now to FIG. 12A, a cross-sectional illustration of a core 1205 is shown, in accordance with an embodiment. The core 1205 may comprise a hole 1250. A perforated ledge 1252 may be provided in the hole 1250 between the first surface 1203 and the second surface 1204 of the core 1205. In an embodiment, a dielectric layer 1281 is provided over surfaces of the perforated ledge 1252. The dielectric layer 1281 may extend through the perforations in the perforated ledge 1252. That is, the dielectric layer may be over the perforated ledge 1252 and under the 1 perforated edge 1252. In an embodiment, a first conductive layer 1257 may be provided under the dielectric layer 1281, and a second conductive layer 1259 may be provided over the dielectric layer 1281. As such, the dielectric layer 1281 is sandwiched between two electrodes to form a capacitor.

Figure 12B:
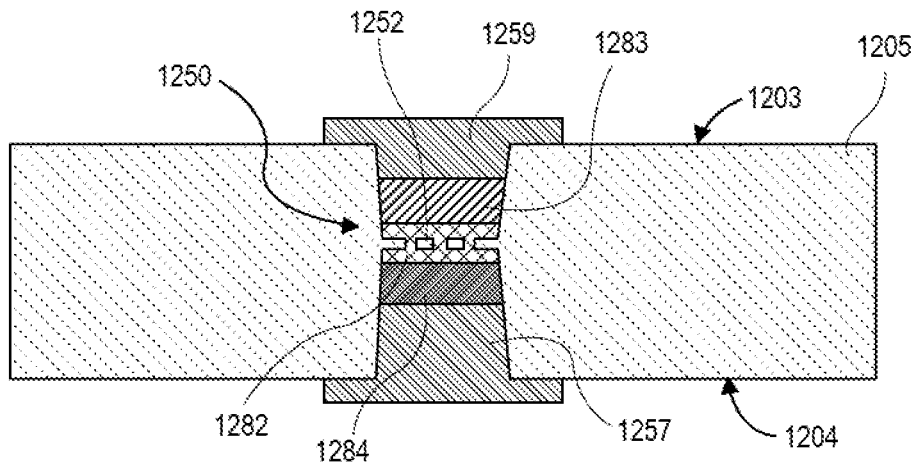
FIG. 12B is a cross-sectional illustration of a battery with a perforated ledge, in accordance with an embodiment.

Referring now to FIG. 12B, a cross-sectional illustration of a core 1205 is shown, in accordance with an additional embodiment. In an embodiment, the core 1205 comprises a hole 1250. A perforated ledge 1252 may be provided in the hole 1250 between the first surface 1203 and the second surface 1204 of the core 1205. In an embodiment, a solid state electrolyte 1282 is provided over surfaces of the perforated ledge 1252. It is to be appreciated that a liquid electrolyte may be used under certain conditions. The solid state electrolyte 1282 may extend through the perforations in the perforated ledge 1252. That is, the solid state electrolyte 1282 may be over the perforated ledge 1252 and under the perforated ledge 1252. In an embodiment, a cathode layer 1283 is over the solid state electrolyte 1282, and an anode layer 1284 is below the solid state electrolyte 1282. A first conductive layer 1257 may be provided under the anode layer 1284, and a second conductive layer 1259 may be provided over the cathode layer 1283. As such, a battery device is provided in the core 1205. Although, not shown here several through via batteries can be connected to enable a series or parallel battery configuration.

Figure 12C:
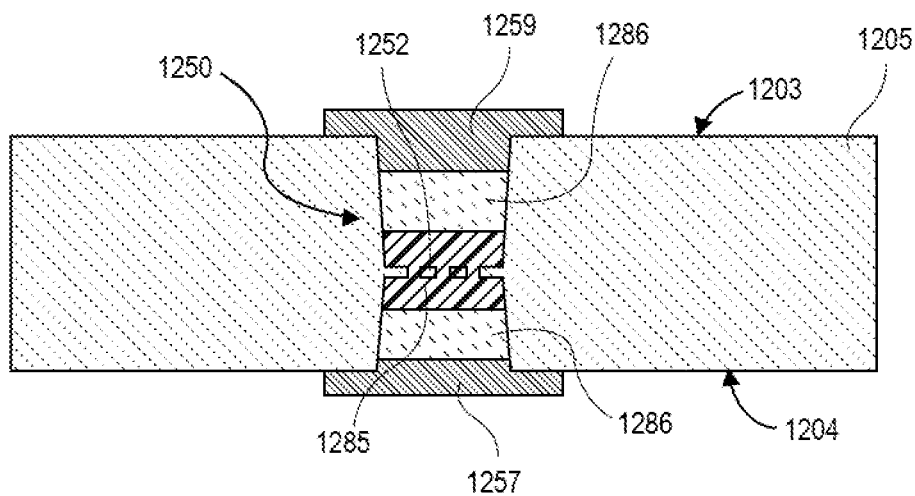
FIG. 12C is a cross-sectional illustration of a magnetic switch with a perforated ledge, in accordance with an embodiment.

Referring now to FIG. 12C, a cross-sectional illustration of a core 1205 is shown, in accordance with an additional embodiment. In an embodiment, the core 1205 comprises a hole 1250. A perforated ledge 1252 may be provided in the hole 1250 between the first surface 1203 and the second surface 1204 of the core 1205. In an embodiment, a magnetic layer 1285 is provided over surfaces of the perforated ledge 1252. The magnetic layer 1285 may extend through the perforations in the perforated ledge 1252. That is, the magnetic layer 1285 may be over the perforated ledge 1252 and under the perforated ledge 1252. In an embodiment, an oxide barrier layer 1286 is over and under the magnetic layer 1285. A first conductive layer 1257 may be provided under the oxide barrier layer 1286, and a second conductive layer 1259 may be provided over the oxide barrier layer 1286. As such, a magnetic switch is provided in the core 1205.

Figure 13:
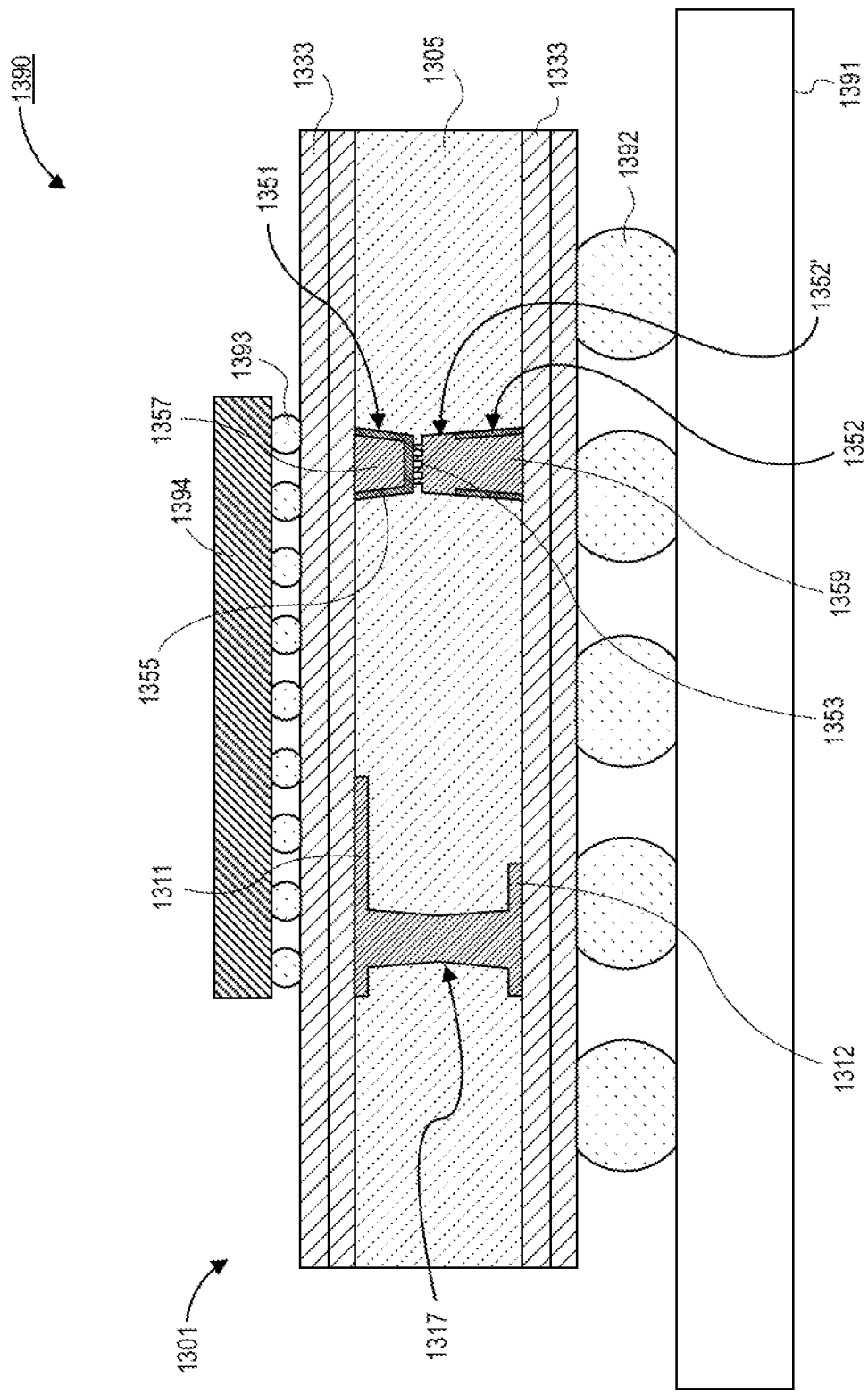
FIG. 13 is a cross-sectional illustration of an electronic system with a package substrate with a glass core that comprises vias fabricated with processes disclosed herein, in accordance with an embodiment.

Referring now to FIG. 13, a cross-sectional illustration of an electronic system 1390 is shown, in accordance with an embodiment. The electronic system 1390 may comprise a board 1391, such as a printed circuit board (PCB) or the like. A package substrate 1301 may be coupled to the board 1391 by interconnects 1392. The interconnects 1392 may be solder balls, sockets, or the like. In an embodiment, a die 1394 may be coupled to the package substrate 1301 by interconnects 1393, such as first level interconnects (FLIs) or the like.

In an embodiment, the package substrate 1301 comprises a core 1305. Buildup layers 1333 may be provided above and/or below the core 1305. The core 1305 may be a glass core or other material capable of undergoing a morphological change when exposed to a laser, as described above. In an embodiment, a via 1317 may be provided through the core 1305. In an embodiment, an embedded trace 1311 and an embedded pad 1312 may be on opposite sides of the via 1317. The via 1317, trace 1311, and pad 1312 may be fabricated with a dual damascene process, similar to embodiments described above.

In an embodiment, the package substrate 1301 may further comprise a via that is fabricated with a perforated ledge 1353. As shown, a first region 1351 may be completely lined by an adhesion layer 1355, and a second region 1352 is partially lined by the adhesion layer 1355. That is, a gap region 1352' may be provided in the second region 1352. A first metal 1357 may fill the first region 1351, and a second metal 1359 may fill the second region 1352.

Figure 14:
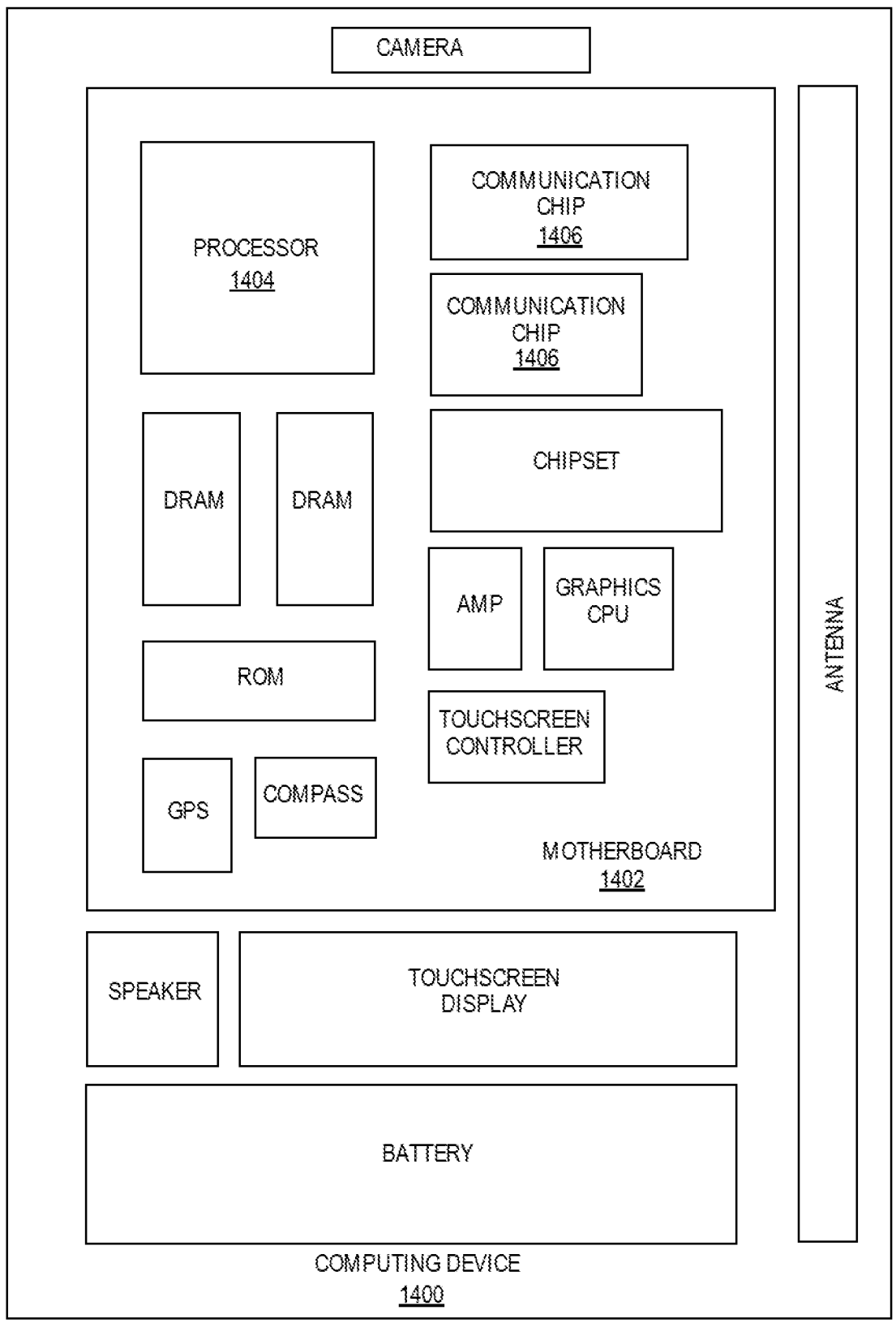
FIG. 14 is a schematic of a computing device built in accordance with an embodiment.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the invention, the integrated circuit die of the processor may be part of an electronic package that comprises a core with vias formed with a laser-assisted etching process, in accordance with embodiments described herein. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the invention, the integrated circuit die of the communication chip may be part of an electronic package that comprises a package substrate with a with vias formed with a laser-assisted etching process, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core with a first surface and a second surface opposite from the first surface; a via hole through the core, wherein the via hole comprises: a first portion; a second portion; and a perforated ledge between the first portion and the second portion; and a via filling the via hole.

Example 2: the package substrate of Example 1, further comprising an adhesion layer in the via hole, wherein the adhesion layer covers the entire first portion of the via hole and a surface of the perforated ledge facing the first portion of the via hole, and wherein the adhesion layer covers a part of the second portion of the via hole.

Example 3: the package substrate of Example 2, wherein the adhesion layer is absent from a surface of the perforated ledge facing the second portion of the via hole.

Example 4: the package substrate of Examples 1-3, wherein the via passes through perforations in the perforated ledge.

Example 5: the package substrate of Examples 1-4, wherein the via hole has sloped sidewalls.

Example 6: the package substrate of Example 5, wherein the via hole has an hourglass shaped cross-section.

Example 7: the package substrate of Examples 1-6, wherein the perforated ledge is at a midpoint between the first surface of the core and the second surface of the core.

Example 8: the package substrate of Examples 1-7, wherein the perforated ledge is closer to the first surface of the core than to the second surface of the core.

Example 9: the package substrate of Examples 1-8, wherein an aspect ratio of the via hole is approximately 6:1 or greater.

Example 10: the package substrate of Example 9, wherein an aspect ratio of the via hole is approximately 10:1 or greater.

Example 11: the package substrate of Example 9 or Example 10, wherein the perforated ledge has a thickness that is approximately 20 µm or less.

Example 12: a method of forming a package substrate, comprising: forming a via hole through a core, wherein the via hole comprises: a first portion; a second portion; and a perforated ledge between the first portion and the second portion; applying an adhesion layer over the via hole; applying a seed layer over the adhesion layer; plating the first portion of the via hole to form a first section of a via; forming a mask over the first section of the via; and plating the second portion of the via hole to form a second section of the via, wherein the second section is electrically coupled to the first section through perforations in the perforated ledge.

Example 13: the method of Example 12, wherein the adhesion layer does not cover the entire second portion of the via hole.

Example 14: the method of Example 12 or Example 13, wherein an aspect ratio of the via hole is approximately 6:1 or greater.

Example 15: the method of Examples 12-14, wherein the via hole has sloped sidewalls.

Example 16: the method of Example 15, wherein the via hole has an hourglass shaped cross-section.

Example 17: the method of Examples 12-16, wherein a thickness of the perforated ledge is approximately 20 µm or less.

Example 18: the method of Examples 12-17, further comprising: etching away the perforated ledge after forming the first section of the via.

Example 19: an electronic system, comprising: a board; a package substrate coupled to the board, wherein the package substrate comprises: a core with a first surface and a second surface opposite from the first surface; a via hole through the core, wherein the via hole comprises: a first portion; a second portion; and a perforated ledge between the first portion and the second portion; and a via filling the via hole; and a die coupled to the package substrate.

Example 20: the electronic system of Example 19, further comprising an adhesion layer in the via hole, wherein the adhesion layer covers the entire first portion of the via hole and a surface of the perforated ledge facing the first portion of the via hole, and wherein the adhesion layer covers a part of the second portion of the via hole.

What is claimed is:

1. A package substrate, comprising:
   a core with a first surface and a second surface opposite from the first surface, wherein the core comprises a single material continuous from the first surface to the second surface;
   a via hole through the single material of the core, wherein the via hole comprises:
   a first portion;
   a second portion;
   a perforated ledge between the first portion and the second portion; and
   an adhesion layer in the via hole, wherein the adhesion layer covers the entire first portion of the via hole and a surface of the perforated ledge facing the first portion of the via hole, and wherein the adhesion layer covers a part of the second portion of the via hole; and
   a via filling the via hole.

2. The package substrate of claim 1, wherein the adhesion layer is absent from a surface of the perforated ledge facing the second portion of the via hole.

3. The package substrate of claim 1, wherein the via passes through perforations in the perforated ledge.

4. The package substrate of claim 1, wherein the via hole has sloped sidewalls.

5. The package substrate of claim 4, wherein the via hole has an hourglass shaped cross-section.

6. The package substrate of claim 1, wherein the perforated ledge is at a midpoint between the first surface of the core and the second surface of the core.

7. The package substrate of claim 1, wherein the perforated ledge is closer to the first surface of the core than to the second surface of the core.

8. The package substrate of claim 1, wherein an aspect ratio of the via hole is approximately 6:1 or greater.

9. The package substrate of claim 8, wherein an aspect ratio of the via hole is approximately 10:1 or greater.

10. The package substrate of claim 8, wherein the perforated ledge has a thickness that is approximately 20 µm or less.

11. An electronic system, comprising:
    a board;
    a package substrate coupled to the board, wherein the package substrate comprises:
    a core with a first surface and a second surface opposite from the first surface, wherein the core comprises a single material continuous from the first surface to the second surface;
    a via hole through the single material of the core, wherein the via hole comprises:
    a first portion;
    a second portion; and
    a perforated ledge between the first portion and the second portion;
    an adhesion layer in the via hole, wherein the adhesion layer covers the entire first portion of the via hole and a surface of the perforated ledge facing the first portion of the via hole, and wherein the adhesion layer covers a part of the second portion of the via hole; and
    a via filling the via hole; and
    a die coupled to the package substrate.

* * * * *